US008929090B2

(12) United States Patent
Nakashima et al.

(10) Patent No.: US 8,929,090 B2
(45) Date of Patent: Jan. 6, 2015

(54) FUNCTIONAL ELEMENT BUILT-IN SUBSTRATE AND WIRING SUBSTRATE

(75) Inventors: Yoshiki Nakashima, Minato-ku (JP); Shintaro Yamamichi, Minato-ku (JP); Katsumi Kikuchi, Minato-ku (JP); Kentaro Mori, Minato-ku (JP); Hideya Murai, Minato-ku (JP)

(73) Assignee: NEC Corporation, Tokyo (JP)

(*) Notice: Subject to any disclaimer, the term of this patent is extended or adjusted under 35 U.S.C. 154(b) by 165 days.

(21) Appl. No.: 13/574,455

(22) PCT Filed: Jan. 7, 2011

(86) PCT No.: PCT/JP2011/050180
§ 371 (c)(1),
(2), (4) Date: Jul. 20, 2012

(87) PCT Pub. No.: WO2011/089936
PCT Pub. Date: Jul. 28, 2011

(65) Prior Publication Data
US 2012/0300425 A1 Nov. 29, 2012

(30) Foreign Application Priority Data

Jan. 22, 2010 (JP) .................................. 2010-012235

(51) Int. Cl.
*H05K 1/18* (2006.01)
*H01L 23/00* (2006.01)
(Continued)

(52) U.S. Cl.
CPC ... *H01L 23/5389* (2013.01); *H01L 2924/18162* (2013.01); *H01L 2224/73267* (2013.01);
(Continued)

(58) Field of Classification Search
CPC ............. H05K 1/00; H05K 1/11; H05K 1/18; H05K 1/185; H05K 3/04; H05K 3/46; H01L 21/56; H01L 23/02; H01L 23/04; H01L 23/34; H01L 23/48; B32B 3/10; B32B 7/00
USPC .................. 361/761, 762, 764; 174/254, 260, 174/262–264; 257/685, 690, 698, 723, 734; 29/830, 852; 428/137; 438/121, 124
See application file for complete search history.

(56) References Cited

U.S. PATENT DOCUMENTS 5,281,151 A * 1/1994 Arima et al. .................... 439/68
5,659,951 A * 8/1997 Gall et al. ....................... 29/830
(Continued)

FOREIGN PATENT DOCUMENTS

JP 2001-24333 A 1/2001
JP 2002-246761 A 8/2002
(Continued)

*Primary Examiner* — Xiaoliang Chen
(74) *Attorney, Agent, or Firm* — Sughrue Mion, PLLC

(57) ABSTRACT

An object of the present invention is to propose a functional element built-in substrate which enables an electrode terminal of a functional element to be well connected to the back surface on the side opposite to the electrode terminal of the functional element, and which can be miniaturized. According to the present invention, there is provided a functional element built-in substrate including a functional element provided with an electrode terminal on one surface side of the functional element, and a wiring substrate including a laminated structure in which the functional element is embedded so that the electrode terminal of the functional element faces the front surface side of the structure, and which is formed at least in a side surface region of the functional element by laminating a plurality of wiring insulating layers each including a wiring, the functional element built-in substrate being featured in that the electrode terminal and the back surface side of the wiring substrate are electrically connected to each other through the wiring of the laminated structure, and in that, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring in the wiring insulating layer, has a relationship that the cross-sectional area of the wiring in the back surface side wiring insulating layer is larger than the cross-sectional area of the wiring in the front surface side wiring insulating layer.

19 Claims, 16 Drawing Sheets

(51) Int. Cl.
*H01L 23/498* (2006.01)
*H01L 23/538* (2006.01)

(52) U.S. Cl.
CPC ....... *H01L 2224/32225* (2013.01); *H01L 24/19*
(2013.01); *H01L 2924/15153* (2013.01); *H01L*
*2224/92244* (2013.01); *H01L 2224/04105*
(2013.01); *H05K 1/185* (2013.01); *H01L*
*23/49838* (2013.01)
USPC ........... 361/761; 361/762; 361/764; 174/254;
174/260; 174/262; 174/263; 174/264; 257/254;
257/260; 257/262; 257/263; 257/264; 29/830;
29/852; 428/137; 438/121; 438/124

(56) References Cited

U.S. PATENT DOCUMENTS

| | | | |
|---|---|---|---|
| 6,321,443 B1* | 11/2001 | Barte et al. .................... | 29/831 |
| 6,404,052 B1 | 6/2002 | Kurita et al. | |
| 6,809,268 B2* | 10/2004 | Hayashi et al. ............... | 174/260 |
| 7,498,668 B2* | 3/2009 | Kawabata et al. ............ | 257/686 |
| 8,008,766 B2* | 8/2011 | Kawabata et al. ............ | 257/686 |
| 2006/0012029 A1 | 1/2006 | Kikuchi et al. | |
| 2006/0083895 A1* | 4/2006 | Ikeda ............................ | 428/137 |
| 2006/0131740 A1* | 6/2006 | Kawabata et al. ............ | 257/723 |
| 2006/0151863 A1* | 7/2006 | Das et al. ...................... | 257/678 |
| 2006/0208356 A1* | 9/2006 | Yamano et al. ............... | 257/734 |
| 2006/0231939 A1* | 10/2006 | Kawabata et al. ............ | 257/686 |
| 2006/0272854 A1* | 12/2006 | Yamano ........................ | 174/264 |
| 2007/0044303 A1* | 3/2007 | Yamano ........................ | 29/830 |
| 2007/0045815 A1* | 3/2007 | Urashima et al. ............. | 257/698 |
| 2007/0057363 A1* | 3/2007 | Nakamura et al. ............ | 257/698 |
| 2007/0076320 A1* | 4/2007 | Endo et al. .................. | 360/97.01 |
| 2007/0119619 A1* | 5/2007 | Nakamura et al. ............ | 174/262 |
| 2007/0178686 A1 | 8/2007 | Honda | |
| 2007/0271783 A1* | 11/2007 | Ikeda ............................ | 29/852 |
| 2008/0007927 A1* | 1/2008 | Ito et al. ........................ | 361/764 |
| 2008/0047737 A1* | 2/2008 | Sahara et al. ................. | 174/254 |
| 2008/0121422 A1* | 5/2008 | Karasawa et al. ............ | 174/262 |
| 2009/0008765 A1* | 1/2009 | Yamano et al. ............... | 257/690 |
| 2009/0188706 A1* | 7/2009 | Endo ............................. | 174/257 |
| 2009/0230541 A1* | 9/2009 | Araki et al. ................... | 257/693 |
| 2009/0255719 A1* | 10/2009 | Yamamoto et al. ........... | 174/260 |
| 2010/0044845 A1* | 2/2010 | Funaya et al. ................ | 257/685 |
| 2010/0103634 A1* | 4/2010 | Funaya et al. ................ | 361/761 |
| 2010/0112759 A1* | 5/2010 | Kobayashi et al. ........... | 438/121 |
| 2010/0134991 A1* | 6/2010 | Kim et al. ..................... | 361/762 |
| 2010/0159647 A1* | 6/2010 | Ito et al. ........................ | 438/124 |

FOREIGN PATENT DOCUMENTS

| | | |
|---|---|---|
| JP | 2004-153084 A | 5/2004 |
| JP | 2005-072328 A | 3/2005 |
| JP | 2006-32600 A | 2/2006 |
| JP | 2006-261246 A | 9/2006 |
| JP | 2007-207872 A | 8/2007 |
| WO | 2007/126090 A1 | 11/2007 |

* cited by examiner 51  52

61

(a)

(b)

(a) 
113

(b) 
114

(c) 
112

(d) 
115  116

FUNCTIONAL ELEMENT BUILT-IN SUBSTRATE AND WIRING SUBSTRATE

CROSS REFERENCE TO RELATED APPLICATIONS

This application is a National Stage of International Application No. PCT/JP2011/050180 filed on Jan. 7, 2011, which claims priority from Japanese Patent Application No. 2010-012235, filed on Jan. 22, 2010, the contents of all of which are incorporated herein by reference in their entirety.

TECHNICAL FIELD

The present invention relates to a functional element built-in substrate in which one or more functional elements, such as semiconductor chips, are embedded, an electronic device including the functional element built-in substrate, and a wiring substrate provided with an opening section.

BACKGROUND ART

In recent years, for the purpose of achieving higher integration and higher performance of an electronic device, such as a semiconductor device, a packaging technique, a so-called functional element built-in technique, for embedding a functional element, such as a semiconductor element, has been proposed. In a functional element built-in substrate, a functional element is embedded in the substrate, and thereby the mounting area of the functional element can be suppressed. In addition to this, other components can be further mounted on the surface of the outermost layer of the substrate, and hence the size of the substrate can be reduced. This technique is expected to be a high-density mounting technique which achieves higher integration and higher performance of an electronic device and which achieves thickness reduction, cost reduction, high-frequency measures, low stress connections, and the like, of a package.

The functional element built-in substrate can exhibit its function by being electrically connected to an external substrate (referred to as so-called "mother board" or "daughter board"). As the number of terminals of a functional element is increased in accordance with the increase in the density of terminals of the functional element, it is required that the wiring is efficiently fanned out from the functional element. As a method in which an effective fan-out configuration can be achieved to obtain connection with an external substrate, there is known a technique in which a build-up layer is provided on a functional element. The build-up layer has a role of enabling a narrow pitch of electrode terminals on a functional element, such as a semiconductor element, to be increased to a pitch of electrode terminals of an external substrate, so as to effect connection of the electrode terminals on the functional element with the electrode terminals of the external substrate. For example, as described in Patent Literature 1, a build-up layer composed of a plurality of wiring layers is provided on a semiconductor element to thereby facilitate connection with an external substrate.

Further, for the purpose of achieving higher integration and higher performance, it is required that the functional element built-in substrate not only facilitates the connection on the side of the terminals of the functional element but also facilitates the connection on the back surface side opposite to the terminals of the functional element. To cope with this, for example, Patent Literature 2 discloses, as shown in FIG. 16, a functional element built-in substrate in which a functional element 301, such as a semiconductor chip, is embedded, and which includes wiring layers 302 provided on both sides thereof, and inner vias 303 for electrically connecting the upper and lower wiring layers to each other.

CITATION LIST

Patent Literature

Patent Literature 1: JP2002-246761A
Patent Literature 2: JP2006-261246A

SUMMARY OF INVENTION

Technical Problem

In the functional element built-in substrate described in Patent Literature 2, the wiring arranged on the side of the terminals of the functional element and the wiring arranged on the side opposite to the terminals of the functional element can be connected to each other by the inner via, but the flexibility of wiring design is low. Further, it is considered to adopt a method such as a method in which, for connection with an external substrate on the back side of the substrate, a build-up layer is provided on the back side of the substrate, but this method is not desirable from the viewpoint of miniaturization. Further, in this method, since the diameter of the inner via is increased, the land diameter of the wiring layer provided on the back surface of the substrate also needs to be increased, which results in a problem of the flexibility of wiring design.

Accordingly, an object of the present invention is to propose a functional element built-in substrate which enables electrode terminals of a functional element to be well connected to the back surface on the side opposite to the terminals of the functional element, and which can be miniaturized.

Solution to Problem

Accordingly, the present invention is a functional element built-in substrate including, a functional element provided with an electrode terminal on one surface side of the functional element, and a wiring substrate including a laminated structure in which the functional element is embedded so that the electrode terminal of the functional element faces the front surface side of the structure, and which is formed at least in a side surface region of the functional element by laminating a plurality of wiring insulating layers each including a wiring, wherein the electrode terminal and the back surface side of the wiring substrate are electrically connected through the wiring of the laminated structure, and wherein, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, has a relationship that the cross-sectional area of the wiring in the back surface side wiring insulating layer is larger than the cross-sectional area of the wiring in the front surface side wiring insulating layer.

Further, the present invention is an electronic device including the functional element built-in substrate.

Further, the present invention is a wiring substrate including, an opening section for embedding a functional element, and a laminated structure which is formed at least in a side surface region of the opening section by laminating a plurality of wiring insulating layers each including a wiring, wherein the front surface side and the back surface side of the wiring substrate are electrically connected at least through the wiring, and wherein, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, has a relationship that the cross-sectional area of the wiring in the back surface side wiring insulating layer is larger than the cross-sectional area of the wiring in the front surface side wiring insulating layer.

Advantageous Effects of Invention

With the configuration according to the present invention, the wiring can be fanned out by effectively using the region around the side surface of the functional element, and hence the electrode terminal of the functional element can be well connected to the back surface on the side opposite to the electrode terminal of functional element. Further, since a multilayer wiring need not be provided on the back side of the substrate, or since, even when a multilayer wiring is used, the thickness of the multilayer wiring can be reduced, the wiring substrate can be miniaturized.

DESCRIPTION OF EMBODIMENTS

In the following, exemplary embodiments will be described in detail with reference to the drawings.

Exemplary Embodiment 1

Figure 1:
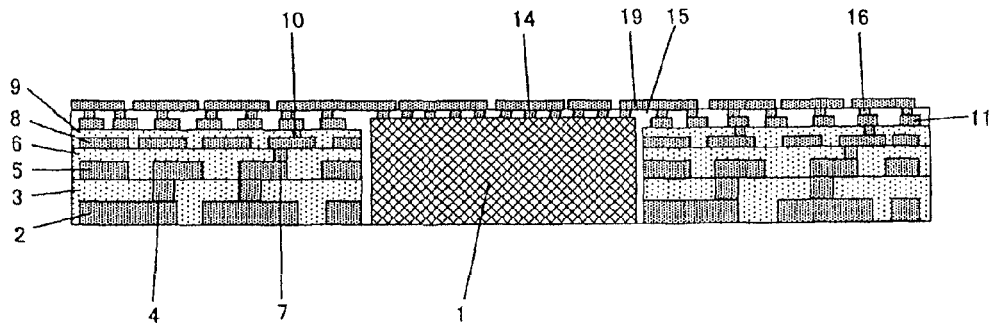
FIG. 1 is a schematic cross-sectional view for explaining a configuration of a functional element built-in substrate according to the present invention.

FIG. 1 is a schematic cross-sectional view showing a configuration example of a functional element built-in substrate according to the present invention.

In FIG. 1, a functional element 1 is arranged at an opening section of a wiring substrate so that the circuit surface of the functional element is arranged on the front surface side of the wiring substrate. In FIG. 1, the upper side is the front surface side, and the lower side is the back surface side. An insulating material 15 is arranged in a gap between the functional element 1 and the wiring substrate. Post electrodes 14 are provided, as electrode terminals, on the circuit surface of the functional element.

The wiring substrate has a laminated structure formed by laminating a plurality of wiring insulating layers, in each of which vias and wirings are formed. In FIG. 1, the wiring substrate is composed of a first wiring insulating layer, a second wiring insulating layer, and a third wiring insulating layer.

The lowermost layer is the first wiring insulating layer which is composed of a first insulating layer 3, first wirings 2, and first vias 4. The first wirings 2 and the first vias 4 are formed in the first insulating layer 3.

The second wiring insulating layer is formed on the first wiring insulating layer. The second wiring insulating layer is composed of a second insulating layer 6, second wirings 5, and second vias 7. The second wirings 5 and the second vias 7 are formed in the second insulating layer 6.

The third wiring insulating layer is formed on the second wiring insulating layer. The third wiring insulating layer is composed of a third insulating layer 9, third wirings 8, and third vias 10. The third wirings 8 and the third vias 10 are formed in the third insulating layer 9.

On the third wiring insulating layer formed on the outermost surface side of the wiring substrate, a first upper wiring layer including first upper wirings 11, and a second upper wiring layer including second upper wirings 19 are formed. The first upper wirings 11 and the second upper wirings 19 are electrically connected to each other by upper vias 16.

Further, the post electrodes 14 as the electrode terminals formed on the surface of the functional element are electrically connected to the vias and the wirings of the wiring substrate via the first upper wirings 11, the upper vias 16, and the second upper wirings 19.

Further, in the exemplary embodiment, the wirings are formed to be extended for connection between the vias. Further, the cross-sectional area of a wiring according to the present invention means the cross-sectional area in the direction (wiring width direction) perpendicular to the extending direction of the wiring.

The present invention is featured in that, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, is configured such that the cross-sectional area of the wiring in the back surface side wiring insulating layer is larger than the cross-sectional area of the wiring in the front surface side wiring insulating layer. With this configuration, a desirable fan-out configuration can be formed between the front surface side and the back surface side of the wiring substrate by using the side surface region of the functional element. That is, since the wiring can be fanned out by effectively using the region around the side surface of the functional element, the electrode terminals of the functional element can be well connected to the wirings and the electrode terminals which are arranged on the back surface side opposite to the electrode terminals of the functional element. Further, since no multilayer wiring needs to be provided on the back side of the substrate, or since, even when a multilayer wiring is provided, the thickness of the multilayer wiring can be reduced, it is possible to miniaturize the functional element built-in substrate.

Further, as described in the exemplary embodiment, it is preferred that, in any pair of the wiring insulating layers which are included in the laminated structure and that are in contact with each other, the cross-sectional shape of the wiring in each of the wiring insulating layers has a relationship that the cross-sectional area of the wiring in the back surface side wiring insulating layer is larger than the cross-sectional area of the wiring in the front surface side wiring insulating layer. In other words, at least in the side surface region of the functional element, the cross sectional shape of the wiring in each of the wiring insulating layers is increased from the front surface side to the back surface side of the wiring substrate. That is, the cross sectional shape of the wiring in each of the wiring insulating layers of the wiring substrate portion formed in the side surface region of the functional element is increased from the front surface side (the side on which the circuit surface of the functional element exists, and the upper surface side in FIG. 1) toward the back surface side (the side opposite to the side on which the circuit surface of the functional element exists, and the lower surface side in FIG. 1) of the wiring substrate. In FIG. 1, among the first wiring 2, the second wiring 5, and the third wiring 8, the cross-sectional shape of the first wiring 2 has the largest area. The cross-sectional shape of the second wiring 5 has the second largest area, and the cross-sectional shape of the third wiring 8 has the smallest area. Note that, FIG. 1 shows a form in which one wiring layer is included in a wiring insulating layer, but two or more wiring layers having the same cross-sectional shape may also be included in the wiring insulating layer.

Figure 17:
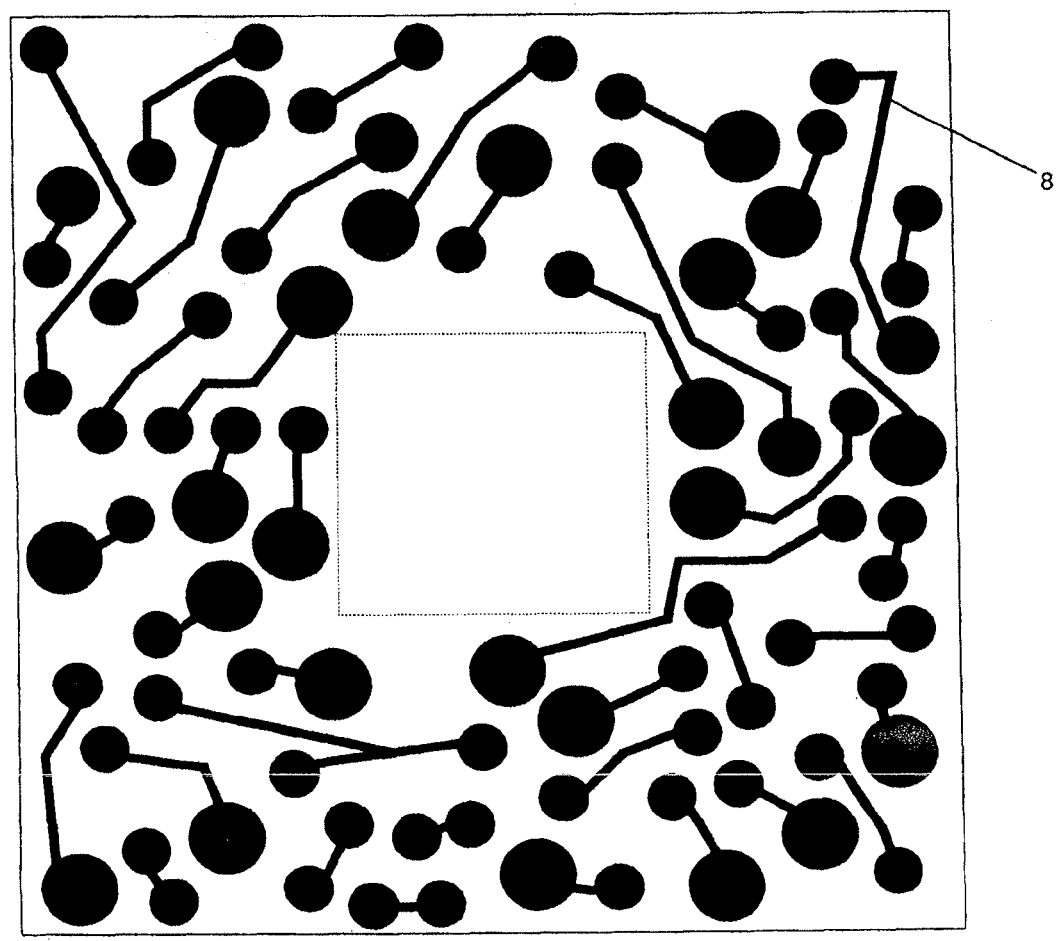
FIG. 17 is a horizontal cross-sectional view showing an example of arrangement of a wiring layer including a wiring 8.
Figure 18:
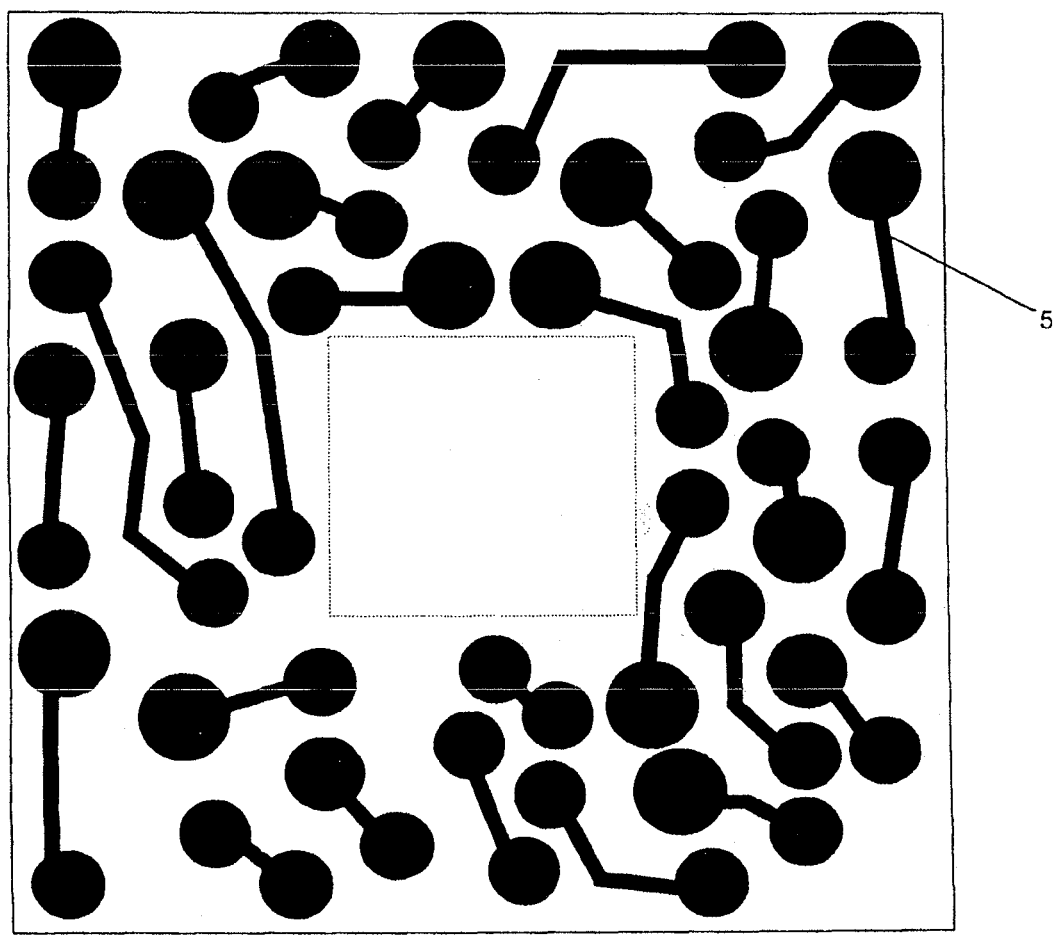
FIG. 18 is a horizontal cross-sectional view showing an example of arrangement of a wiring layer including a wiring 5.
Figure 19:
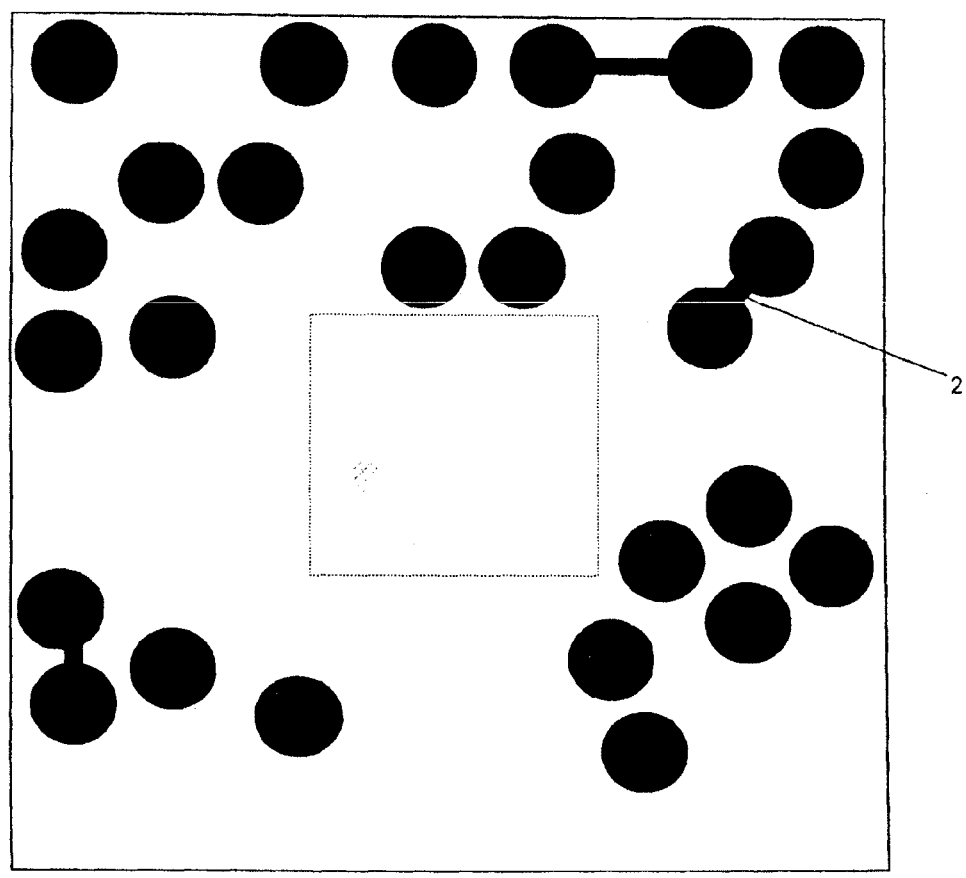
FIG. 19 is a horizontal cross-sectional view showing an example of arrangement of a wiring layer including a wiring 2.

The horizontal direction cross-sectional views (hereinafter abbreviated as horizontal cross-sectional views) of each of the wiring layers corresponding to FIG. 1 according to the exemplary embodiment are shown in FIG. 17 to FIG. 19. FIGS. 17, 18 and 19 are horizontal cross-sectional views of the wiring layers including the wirings 8, 5 and 2, respectively. Note that these horizontal cross-sectional views are only examples and do not limit the present invention at all. As shown in FIG. 17 to FIG. 19, the width of the wiring of each of the wiring layers is increased from the front surface side to the back surface side of the wiring substrate, that is, the area of the cross-sectional shape of the wiring of each of the wiring layers is increased from the front surface side wiring layer to the back surface side wiring layer. With this configuration, the electrode terminals of the functional element can be effectively connected to the back surface of the wiring substrate.

Further, the upper wiring has at least a role of electrically connecting the front surface side (circuit formation surface) of the functional element to the front surface side of the wiring substrate. The upper wiring layer is a concept of a layer including the upper wiring, and can also be formed in an insulating layer. For example, in FIG. 1, the first upper wiring layer is formed in the insulating material 15. Further, as shown in FIG. 1, the upper wiring layer can also be exposed on the surface of the functional element built-in substrate. In FIG. 1, the second upper wiring layer is exposed on the front surface side. Note that the first upper wiring 11 may also include lands or may be formed only by lands.

Further, in the exemplary embodiment, the front surface side (circuit formation surface) of the functional element is electrically connected to the front surface side of the wiring substrate by the upper wiring layer (two layers in the FIG. 1). However, the connection is not limited to this exemplary embodiment, and as the other exemplary embodiment, the front surface side of the functional element can be electrically connected to the front surface side of the wiring substrate by using, for example, wires, the other wiring substrate, or the other functional element.

The functional element includes active components, such as a semiconductor, and passive components, such as a capacitor. The semiconductor includes, for example, a transistor, IC, LSI, and the like. The type of the semiconductor is not limited in particular, but for example, CMOS (Complementary Metal Oxide Semiconductor) can be selected.

The cross-sectional shape of a wiring means the shape of the cross-section of the wiring, which is taken along the plane perpendicular to the extension direction of the wiring. In the present invention, in a pair of the wiring insulating layers which are included in the laminated structure and that are in contact with each other, the cross-sectional shape of the wiring in each of the wiring insulating layers is configured such that the cross-sectional area of the wiring in the back surface side wiring insulating layer is larger than the cross-sectional area of the wiring in the front surface side wiring insulating layer. The cross-sectional shape of the wiring is usually fixed in one wiring insulating layer. However, when the wiring has different cross-sectional shapes in one wiring insulating layer, a state where the cross-sectional area of the wiring is large means a state where the minimum cross-sectional area of the wiring in the back surface side wiring insulating layer is larger than the minimum cross-sectional area of the wiring in the front surface side wiring insulating layer. Further, it is preferred that the minimum cross-sectional area of the wiring in the back surface side wiring insulating layer is larger than the minimum cross-sectional area of the wiring in the front surface side wiring insulating layer, and that the maximum cross-sectional area of the wiring in the back surface side wiring insulating layer is larger than the maximum cross-sectional area of the wiring in the front surface side wiring insulating layer. Further, it is more preferred that the minimum cross-sectional area of the wiring in the back surface side wiring insulating layer is larger than the maximum cross-sectional area of the wiring in the front surface side wiring insulating layer. Further, in the present invention, it is preferred that the width of the wiring is fixed for each of the wiring insulating layers. Note that the extension direction of a wiring is the direction in which the wiring is arranged, and which can also be regarded as the running direction of the wiring. When the wiring is formed in a curved shape, a tangent of the curved shape is set as an extension direction. Further, the cross-sectional shape of a wiring is a concept indicating the cross-sectional shape of a main wiring portion of the wiring and excluding the cross-sectional shape of the land portion of the wiring.

Further, in the present invention, the wiring insulating layer can include one wiring layer, and can also include two or more wiring layers which have the equivalent cross-sectional area. In the case where each of a plurality of the wiring insulating layers includes one wiring layer, in the exemplary embodiment, the wiring layers in the laminated structure have a construction in which the cross-sectional area of the wiring of each of the wiring insulating layers is increased from the front surface side to the back surface side, and hence this configuration is preferred in particular. Further, in the case where, among a plurality of the wiring insulating layers, at least one of the wiring insulating layers includes two or more wiring layers having the equivalent cross-sectional area, the wiring layers located vertically adjacent to each other may have the equivalent cross-sectional area in a part of the laminated structure of the exemplary embodiment. In any of the cases, the wiring can be fanned-out by effectively using the region around the side surface of the functional element, and hence the electrode terminals of the functional element can be well connected to the back surface opposite to the electrode terminals of the functional element. Further, it is preferred that the two or more wiring layers, included in the wiring insulating layer and having the same cross-sectional area, have the same cross-sectional shape.

As described above, the exemplary embodiment has a construction in which the cross-sectional area of the wiring in each of the wiring insulating layers is increased for each of the wiring insulating layers from the front surface side to the back surface side. In order that the cross-sectional area of the wiring in each of the wiring insulating layers is increased for each of the wiring insulating layers, it is preferred that one of the width and the height of the cross-sectional shape of the wiring in each of the wiring insulating layers is increased for each of the wiring insulating layers, and it is more preferred that both the width and the height of the cross-sectional shape of the wiring in each of the wiring insulating layers is increased for each of the wiring insulating layers. Further, when the wiring has different cross-sectional shapes in one wiring insulating layer, it is preferred that the minimum width of the cross-sectional shape of the wiring in the back surface side wiring insulating layer is larger than the minimum width of the cross-sectional shape of the wiring in the front surface side wiring insulating layer. Here, the width of the wiring indicates the distance of the wiring in the direction which is in parallel with the plane direction of the wiring substrate and which is perpendicular to the extending direction of the wiring. Further, the height of the wiring indicates the distance of the wiring in the direction which is perpendicular to the plane direction of the wiring substrate.

The width of the wiring in the wiring insulating layer on the side closest to the front surface of the wiring substrate, and the width of the wiring in the wiring insulating layer on the side closest to the back surface of the wiring substrate are set to 3 to 50 µm and 50 to 1000 µm, respectively. It is preferred that the widths are set to 3 to 20 µm and 50 to 500 µm, respectively. It is more preferred that the widths are set to 3 to 15 µm and 50 to 100 µm, respectively. However, the widths are not limited to these values. Further, the minimum interval between the wirings can be set to be the same as the width of the wiring.

The height of the wiring in the wiring insulating layer on the side closest to the front surface of the wiring substrate, and the height of the wiring in the wiring insulating layer on the side closest to the back surface of the wiring substrate are set to 1 to 20 µm and 15 to 100 µm, respectively. It is preferred that the heights are set to 1 to 15 µm and 17 to 50 µm, respectively. It is more preferred that the heights are set to 1 to 10 µm and 17 to 30 µm, respectively. However, the heights are not limited to these values.

Further, in a pair of the wiring insulating layers which are included in the laminated structure and that are in contact with each other, the ratio of the cross-sectional area of the front surface side wiring insulating layer and the cross-sectional area of the back surface side wiring insulating layer can be set to a range of, for example, 1.1 to 10. The ratio is preferably set to a range of 1.3 to 7, and more preferably set to a range of 1.5 to 5. However, the ratio is not limited to these values. When the ratio of the cross-sectional areas is set to 1.3 or more, the wiring can be more effectively fanned out from the front surface side to the back surface side of the wiring substrate. Further, when the ratio of cross-sectional areas is set to 7 or less, a change in the shape at each boundary surface between the wiring insulating layers can be suppressed to be small, thereby the signal quality can be further improved.

Further, in the present invention, it is preferred that, in a relationship between a pair of the wiring insulating layers which are included in the laminated structure and that are in contact with each other, the area of the horizontal cross-sectional shape of a via in the back surface side wiring insulating layer is larger than the area of the horizontal cross-sectional shape of a via in the front surface side wiring insulating layer. Further, it is preferred that the horizontal cross-sectional shape of the via is enlarged for each of the wiring insulating layer from the front surface side to the back surface side of the wiring substrate. The horizontal cross-sectional shape of a via indicates the top shape of the via (the via shape on the front surface side of the wiring substrate), and the bottom shape of the via (the via shape on the back surface side of the wiring substrate). The state where the area of the horizontal cross-sectional shape of a via is large means the state where one of the area of the top shape of the via and the area of the bottom shape of the via is larger. It is preferred that, in this state, both the areas of the top shape and the bottom shape are larger. Note that, in the present specification, the top shape of a via means the via shape on the front surface side of the wiring substrate, and the bottom shape of a via means the via shape on the back surface side of the wiring substrate. Further, when the horizontal cross-sectional shape of a via becomes large, it is preferred that the land portion in contact with the via is formed to be large in correspondence with the shape of the via. The land portion is usually formed to have a land diameter larger than the diameter of the via, and the land diameter can be set to, for example, about twice the diameter of the portion of the via, which portion is in contact with the land.

Further, it is preferred that the area of the vertical cross-sectional shape of the via is also increased in each of the wiring insulating layers from the front surface side to the back surface side. That is, it is preferred that, in a relationship between a pair of the wiring insulating layers which are included in the laminated structure and that are in contact with each other, the area of the vertical cross-sectional shape of a via of the back surface side wiring insulating layer is larger than the area of the vertical cross-sectional shape of a via of the front surface side wiring insulating layer. The vertical cross-sectional shape of a via means the shape of the cross-section which is taken along the plane passing through the centers of the top surface and the bottom surface of the via.

Figure 2:
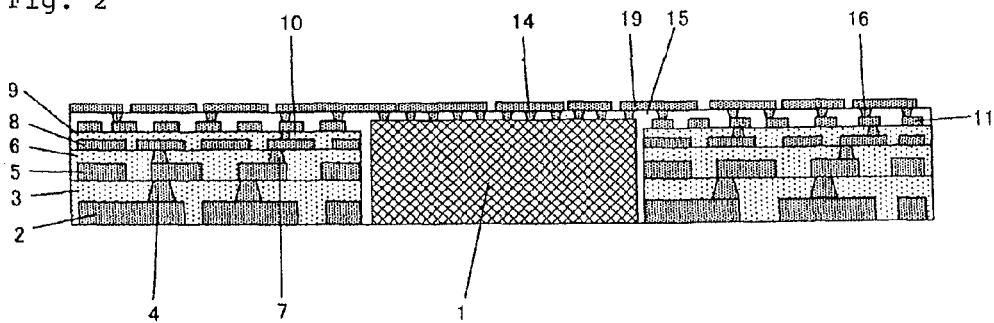
FIG. 2 is a schematic cross-sectional view showing an exemplary embodiment.

Further, it is preferred that the via shape on the bottom side (the back surface side of the wiring substrate) of a via is larger than the via shape on the top side (the front surface side of the wiring substrate) of the via (see FIG. 2). That is, as shown in FIG. 2, a via can be formed so that the diameter thereof on the back surface side of the wiring substrate is larger than the diameter thereof on the front surface side of the wiring substrate. In the present invention, since the cross-sectional shape of the wiring is increased from the front surface side to the back surface side, the via bottom diameter on the back surface side is made larger than the via top diameter on the front surface side. Thereby, a change in the via diameter at the boundary surface between the via and the wiring can be suppressed, signal reflection can be reduced, and signal quality can be improved. Also, when a land is provided, the land diameter can be increased in each of the wiring insulating layers from the front surface side to the back surface side, so that the wiring containing rate can be improved.

Figure 3:
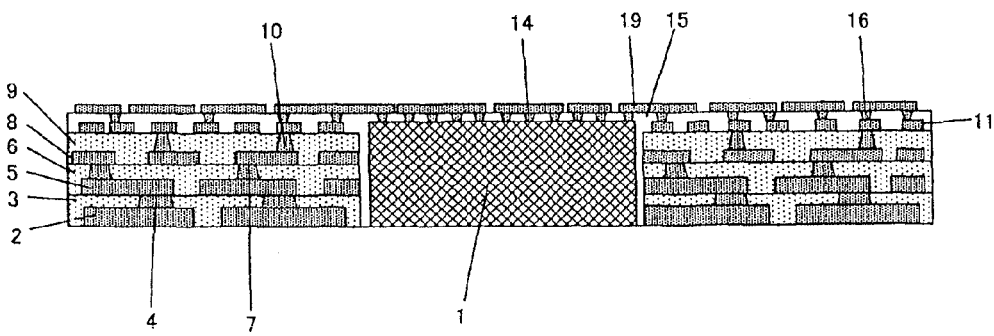
FIG. 3 is a schematic cross-sectional view showing an exemplary embodiment.

Further, in the present invention, each of the wiring insulating layers is not limited in particular and can be formed, for example, to have the same thickness as shown in FIG. 3. However, it is preferred that, in a pair of the wiring insulating layers which are included in the laminated structure and that are in contact with each other, the thickness of the wiring insulating layer on the back surface side is larger than the thickness of the wiring insulating layer on the front surface side. That is, it is preferred that the thickness of the wiring insulating layer is increased for each of the wiring insulating layers from the front surface side to the back surface side of the wiring substrate. This is because, when the thickness of the wiring insulating layer is increased in accordance with the increase in the cross-sectional shape of the wiring, a short circuit between the wiring insulating layers can be prevented. Further, this is because it is preferred that, when the cross-sectional shape of a via is enlarged while the aspect ratio of the via of each of the insulating layers is fixed as much as possible, the thickness of the wiring insulating layer is increased in correspondence with the increase in the cross-sectional shape of the via.

Here, the aspect ratio of the via height to the via diameter is preferably set to 0.3 or more to 3 or less, and more preferably to 0.5 or more to 1.5 or less. It is still more preferred to set the aspect ratio to around 1.

Further, when the horizontal cross-sectional shape of the via, and the cross-sectional shape of the wiring are gradually enlarged from the wiring insulating layer (the layer on the front surface side of the wiring substrate) closest to post electrodes on a functional element, such as a semiconductor element, toward the back surface side, a change in the cross-sectional shape at each boundary surface between the wiring insulating layers can be suppressed to be small. Thereby, signal reflection can be further reduced, and signal quality can be further improved.

In particular, it is preferred that the cross-sectional shape of the wiring and the horizontal cross-sectional shape of the via are enlarged for each of the wiring insulating layers from the front surface side to the back surface side of the wiring substrate so that the aspect ratio of the via height to the via diameter becomes 0.5 or more to 1.5 or less. With this configuration, change in the cross-sectional shape at each boundary surface between the wiring insulating layers can be suppressed to be small, so that signal reflection can be further reduced, and signal quality can be further improved. Note that a larger one of the top diameter and the bottom diameter of a via is used as the via diameter in the aspect ratio.

The number of the wiring insulating layers of the wiring substrate, which can be set to two or more, is preferably set to 3 to 8, and more preferably to 4 to 6. The number of the wiring insulating layers can be adjusted as required. An increased number of layers are preferred because the design flexibility of wiring is increased by the increase in the number of layers. Note that the number of the wiring insulating layers is not limited to the number of layers shown in the figures and the exemplary embodiment.

Note that, other than the cross-sectional shape of the wiring, FIG. 1 shows the form in which the size of the horizontal and vertical cross-sectional shapes of the via and the thickness of the insulating layer are increased, but the present invention is not limited in particular to this form. In the present invention, at least the cross-sectional shape of the wiring needs only to be increased for each of the wiring insulating layers.

Further, the functional element built-in substrate according to the exemplary embodiment includes, at least in the side surface region of the functional element, the structure in which the cross-sectional shape of the wiring is enlarged for each of the wiring insulating layers from the front surface side to the back surface side of the wiring substrate. That is, the functional element built-in substrate is configured such that the cross-sectional shape of the wiring of the portion of the wiring substrate, which portion is arranged in the side surface direction of the functional element, is enlarged for each of the wiring insulating layers.

Further, in the above explanation of the functional element built-in substrate shown in FIG. 1, the second upper wiring 19 and the first upper wiring 11 are described as the upper wiring in the upper wiring layer. However, there is no problem when only the second upper wiring 19 is regarded as the upper wiring, and when the first upper wiring 11 is regarded as the wiring of the wiring substrate. That is, in FIG. 1, the wiring denoted by reference numeral 11 can be regarded as a fourth wiring, and in this case, the areas of the cross-sectional shapes of the first wiring 2, the second wiring 5, the third wiring 8, and the fourth wiring are reduced in this order.

With the configuration according to the present invention, the wiring can be fanned out by effectively using the region around the side surface of the functional element, and hence the electrode terminals of the functional element can be well connected to the back surface on the side opposite to the electrode terminals of the functional element. Further, since it is not necessary to provide a multilayer wiring on the back side of the substrate, or since, even when a multilayer wiring is used, the thickness of the multilayer wiring can be reduced, the functional element built-in substrate can be miniaturized.

Further, with the configuration according to the present invention, the upper wiring included in the upper wiring layer can be finely formed, and hence the wiring is more preferably fanned out, so that the functional element built-in substrate can be miniaturized.

Further, in the wiring of the wiring substrate, the wiring of the uppermost wiring insulating layer can be most finely formed. Therefore, even when the pitch of the post electrodes provided on the functional element is small, the pitch of the wiring of the uppermost wiring insulating layer (hereinafter also referred to as closest layer) can be reduced to a small value (for example, 3 to 20 μm) corresponding to the small pitch of the post electrodes. Further, since the wiring pitch can be increased by using the wiring of the closest layer (the third wiring 8 in FIG. 1), the cross-sectional shape of the via and the wiring under the closest layer can be enlarged, and the pitch of the via and the wiring can be increased. By the use of the increased pitch of the via and the wiring, it is possible to reduce the cost and to improve the reliability.

Figure 16:
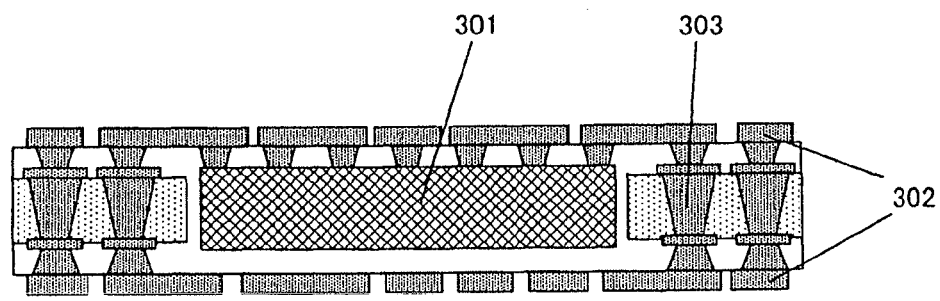
FIG. 16 is a schematic cross-sectional view for explaining an example of a conventional functional element built-in substrate.

Further, with the configuration according to the present invention, the diameter of the via can be made smaller than the diameter of the inner via in the related art described in connection with FIG. 16, and hence the design flexibility of wiring can be increased.

Exemplary Embodiment 2

Preferred forms of the present invention include a functional element built-in substrate in which the cross-sectional shapes of the upper wiring and the wiring are increased for each of the wiring layers from the front surface side (upper side) of the upper wiring layer to the back surface side of the wiring substrate.

That is, it is preferred that, also in the upper wiring layers which electrically connect the electrode terminals of the functional element to the wiring of the wiring substrate, the cross-sectional area of the upper wiring is increased for each of the wiring layers in the direction from the electrode terminals of the functional element toward the back surface side of the wiring substrate. Specifically, it is preferred that, in FIG. 1, the area of the cross-sectional shape of the wiring is increased in the order of the second upper wiring 19, the first upper wiring 11, the third wiring 8, the second wiring 5, and the first wiring 2.

The functional element built-in substrate will be described more specifically with reference to FIG. 1. First, an upper wiring layer A including the upper wiring 19 is provided above the functional element and the wiring substrate. An upper wiring layer B including the upper wiring 11 is provided between the upper wiring layer A and the wiring substrate. The upper wiring layer A has a role of fanning out the wiring from the functional element in the horizontal direction. The upper wiring layer B has a role of electrically connecting the upper wiring 19 to the wiring in the closest layer (the third wiring 8 in FIG. 1). Further, a plurality of the upper wiring layers B may be provided. In the exemplary embodiment, the cross-sectional area of the upper wiring 11 in the upper wiring layer B is larger than the cross-sectional area of the upper wiring 19 in the upper wiring layer A. Further, when a plurality of the upper wiring layers B are provided, it is preferred that the cross-sectional area of each of the upper wiring layers is increased from the front surface side to the back surface side (from the upper side to the lower side) of the upper wiring layer.

Further, it is preferred that, in the upper wiring layer in contact with the wiring insulating layer on the outermost surface side of the wiring substrate, the area of the cross-sectional shape of the upper wiring, which cross-sectional shape is taken along the plane perpendicular to the extending direction of the upper wiring, is smaller than the area of the cross-sectional shape of the wiring, which cross-sectional shape is taken along the plane perpendicular to the extending direction of the wiring in the outermost surface side of the wiring substrate. That is, in FIG. 1, the cross-sectional area of the upper wiring 11 is smaller than the cross-sectional area of the third wiring 8.

With the configuration of the exemplary embodiment, an effective fan-out configuration between the electrode terminals of the functional element and the back surface side of the wiring substrate can be achieved also by using the upper wiring layer.

Note that, as described above, when the wiring denoted by reference numeral 11 is regarded as the fourth wiring included in the wiring substrate, the upper wiring layer is composed of one layer, and hence it is preferred that the cross-sectional area of the upper wiring 19 is smaller than the cross-sectional area of the fourth wiring 11.

Also, in the exemplary embodiment, it is of course preferred that the horizontal cross-sectional shape of the via is increased for each of the wiring layers from the front surface side of the upper wiring layer to the back surface side of the wiring substrate.

Figure 20:
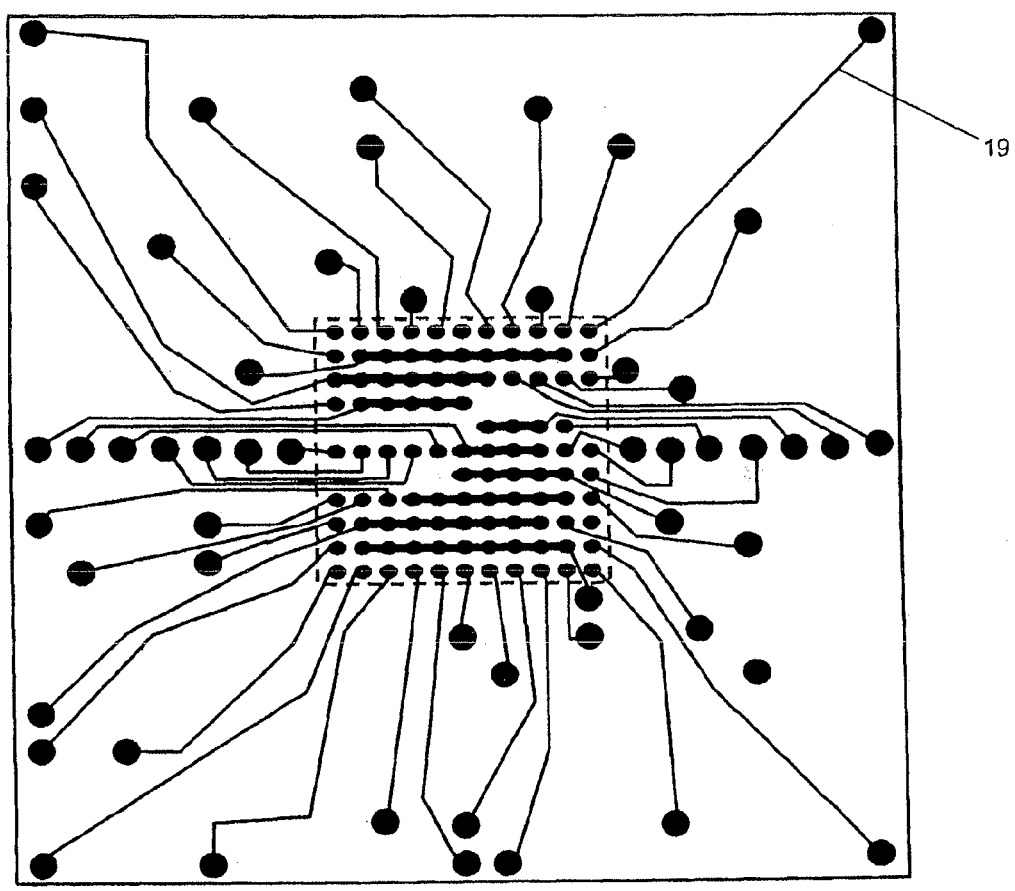
FIG. 20 is a horizontal cross-sectional view showing an example of arrangement of an upper wiring layer including an upper wiring 19.
Figure 21:
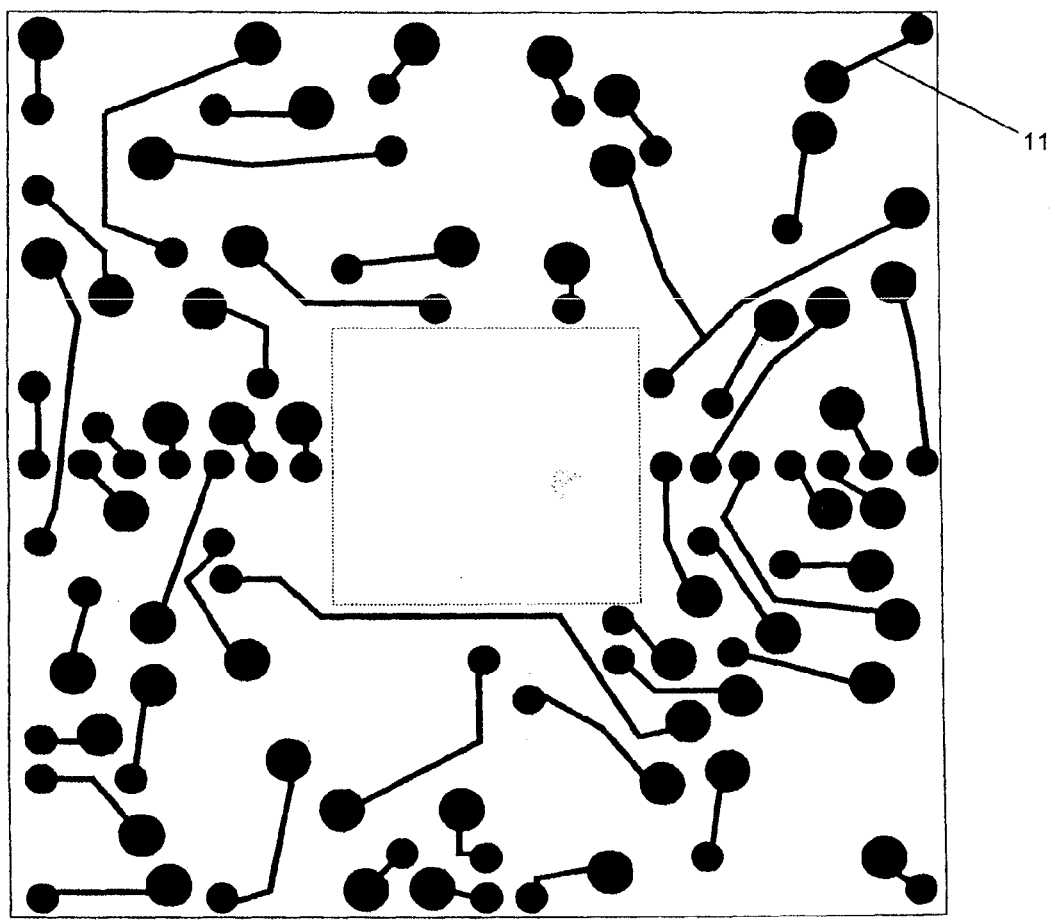
FIG. 21 is a horizontal cross-sectional view showing an example of arrangement of an upper wiring layer including an upper wiring 11.

FIGS. 17 to 21 show examples of horizontal direction cross-sectional views (hereinafter abbreviated as horizontal cross-sectional views) of the respective layers corresponding to FIG. 1 of the exemplary embodiment. FIGS. 17, 18 and 19 are, as described above, horizontal cross-sectional views of the wiring layers which include the wirings 8, 5 and 2, respectively. FIGS. 20 and 21 are horizontal cross-sectional views of the upper wiring layers which include the upper wirings 19 and 11, respectively. Note that these horizontal cross-sectional views are only examples and do not limit the present invention at all. As shown in FIGS. 17 to 21, the width of the upper wiring and of the wiring is increased for each of the wiring layers from the front surface side of the upper wiring layer to the back surface side of the wiring substrate. That is, the area of the cross-sectional shape of the wiring is increased for each of the wiring layers from the front surface side layer to the back surface side layer. With this configuration, the electrode terminals of the functional element can be well connected to the wiring 2 arranged on the back surface side of the wiring substrate.

Exemplary Embodiment 3

Figure 4:
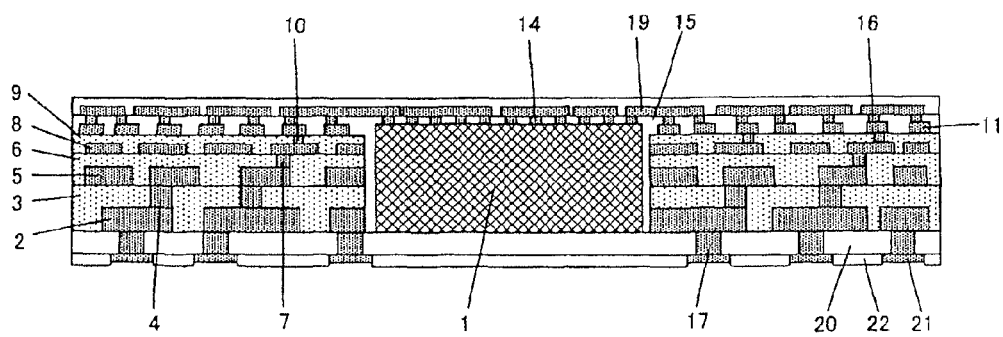
FIG. 4 is a schematic cross-sectional view showing an exemplary embodiment.

As shown in FIG. 4, in the present invention, electrode terminals 21 can be provided on the back surface of the functional element built-in substrate. For example, in FIG. 4, the first wiring 2 and the electrode terminal 21 provided in an insulator layer 22 are electrically connected to each other by a via 17.

Figure 22:
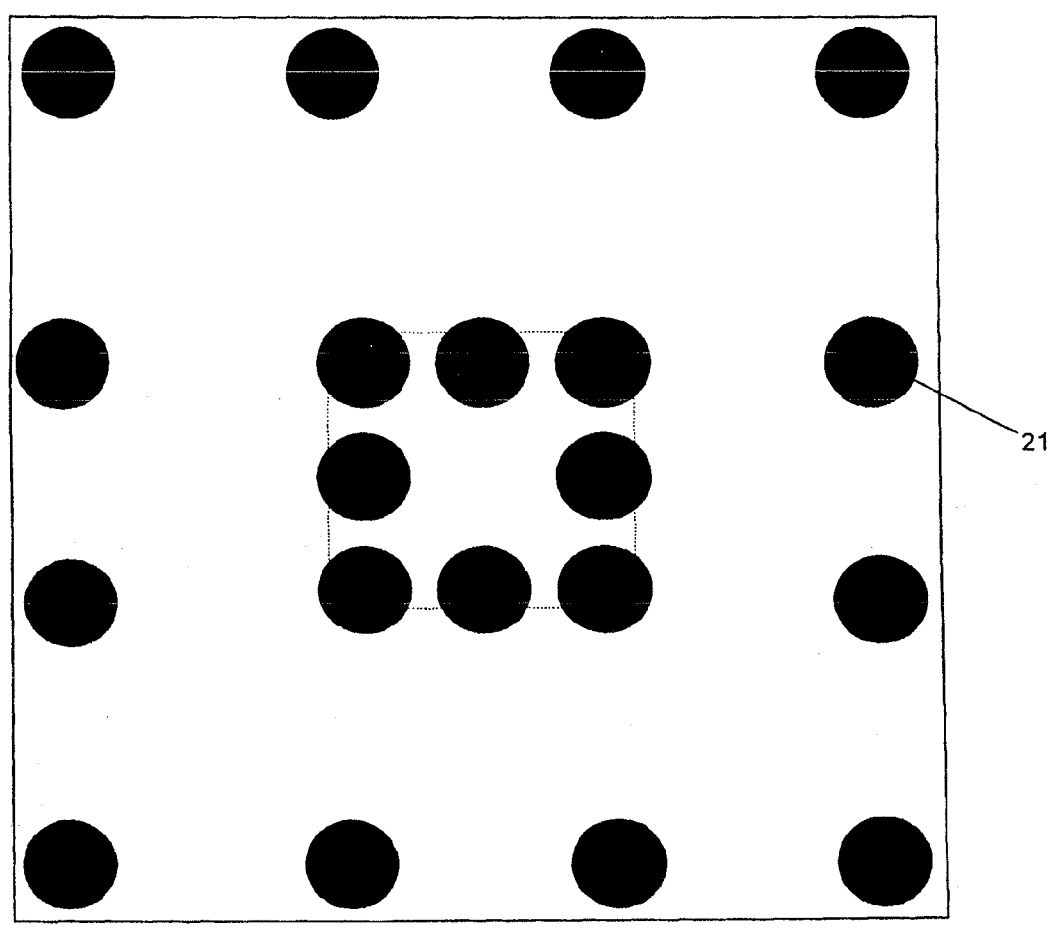
FIG. 22 is a horizontal cross-sectional view showing an example of arrangement of electrode terminals 21 in FIG. 4.

FIG. 22 is a horizontal cross-sectional view showing an arrangement of the electrode terminals 21 in FIG. 4. The other portions of the functional element built-in substrate can be configured as shown in FIGS. 17 to 21. With this configuration, the electrode terminals of the functional element can be well connected to the electrode terminals 21 arranged on the back surface of the wiring substrate.

Further, the electrode terminals 21 and the insulator layer 22 can be formed substantially in one plane, but in FIG. 4, the electrode terminals 21 are formed to be recessed from the insulator layer 22. The state in which the electrode terminals 21 are recessed from the surface of the insulator layer 22 is advantageous for forming a solder ball, and the like, on the surface of the insulator layer 22. That is, the insulator layer 22 functions as a resist to enable the solder ball, and the like, to be formed only in the recessed portion, and hence it is not necessary to separately provide a resist pattern for formation of the solder ball. Further, the electrode terminal 21 may also be projected from the insulator layer 22.

The electrode terminal 21 can be formed of at least one metal or an alloy of metals selected from the group consisting of, for example, gold, silver, copper, tin, and a solder material. In the exemplary embodiment, for example, nickel with 3 μm thickness and gold with 0.5 μm thickness can be laminated in order.

The pitch of the electrode terminals 21 for the solder ball connection, and the like, which are provided on the back surface of the functional element built-in substrate, is set to, for example, 50 to 1000 μm, and more preferably 50 to 500 μm.

It is preferred that the insulator layer 22 is formed for protecting the functional element and for providing incombustibility. Examples of the material of the insulator layer 22 includes organic materials, such as epoxy-based, acrylic-based, urethane-based, and polyimide-based, and further, a filler made of an inorganic material or an organic material may also be added as required.

Exemplary Embodiment 4

Figure 5:
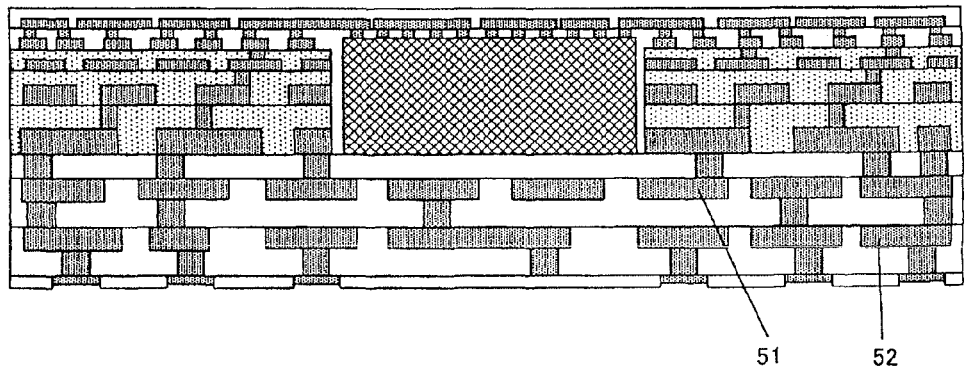
FIG. 5 is a schematic cross-sectional view showing an exemplary embodiment.

Further, as shown in FIG. 5, in the present invention, one or more back surface wiring layers may be further provided on the back surface of the wiring substrate. FIG. 5 shows a functional element built-in substrate provided with two back surface wiring layers 51 and 52. In the present invention, as described above, the pitch adjustment and the wiring design can be performed in the wiring substrate portion around the side surface of the functional element, and hence the thickness of the functional element built-in substrate of the present invention can be reduced as compared with the related art.

Figure 23:
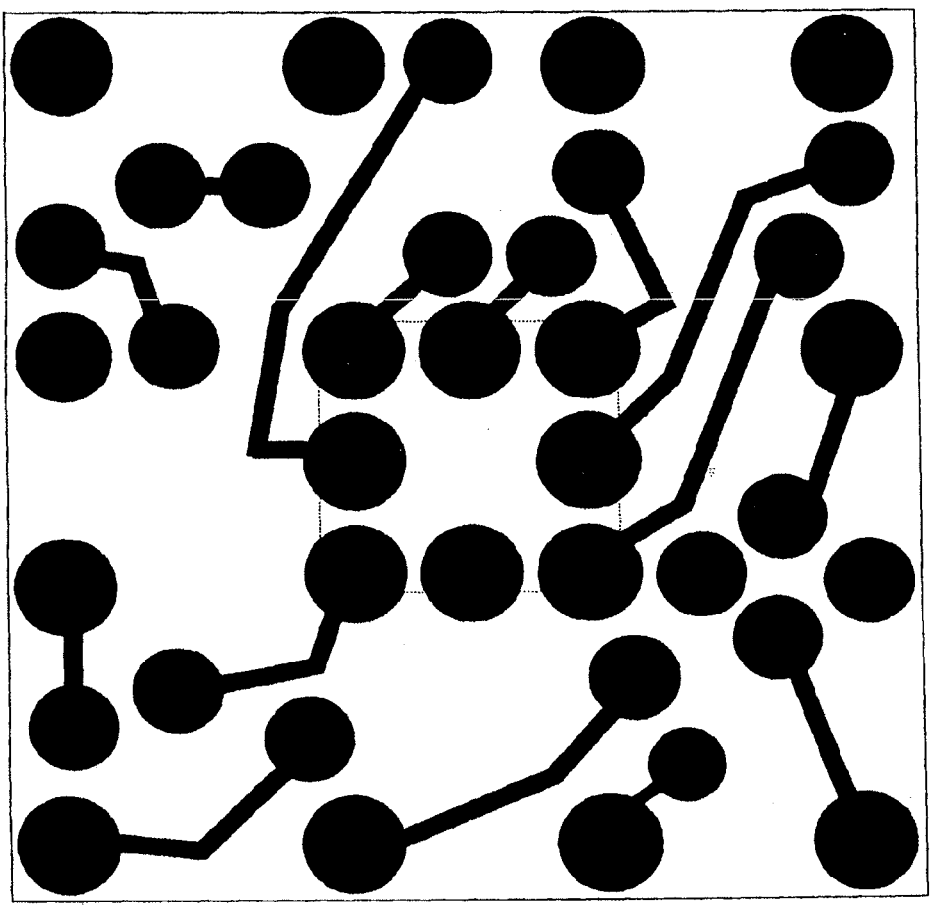
FIG. 23 is a horizontal cross-sectional view showing an example of arrangement of a wiring layer including a wiring 51 in FIG. 5.

FIG. 23 is a horizontal sectional view of a wiring insulating layer including the wiring 51 in FIG. 5. The width of the wiring 51 is not limited in particular, but is preferably set to the width or more of the lowermost wiring layer of the wiring substrate. The other portions of the functional element built-in substrate can be configured, for example, as shown in FIGS. 17 to 21. With this configuration, the electrode terminals of the functional element can be well connected to the wiring 51 or the wiring 52 which are arranged on the back surface of the wiring substrate.

Exemplary Embodiment 5

Figure 6:
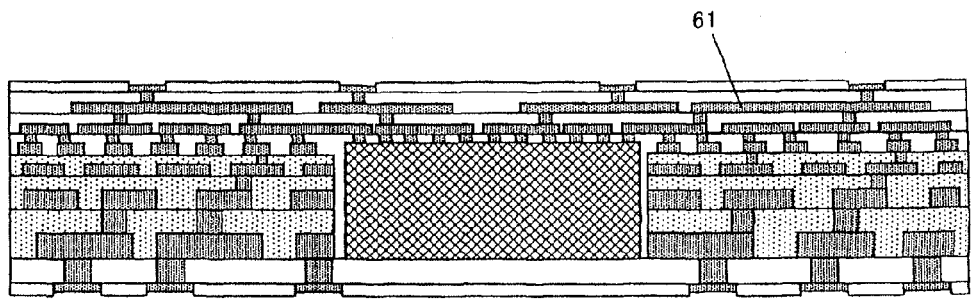
FIG. 6 is a schematic cross-sectional view showing an exemplary embodiment.

Further, as shown in FIG. 6, in the present invention, one or more front wiring layers may be provided on the front surface of the functional element built-in substrate. That is, a wiring layer can be further provided as the upper layer of the upper wiring layer. FIG. 6 shows a functional element built-in substrate provided with a back surface wiring layer 61. Further, for example, as shown in FIG. 6, when the functional element built-in substrate is configured such that electrodes terminals are provided on both the front and back surfaces of the functional element built-in substrate, an external substrate or the other functional element can be connected to both the upper and lower sides of the functional element built-in substrate, and hence further miniaturization of a device can be achieved. In this configuration, external connection terminals are provided on both sides of the functional element built-in substrate, and hence the other semiconductor element and an electronic component can also be mounted on both sides of the substrate.

Exemplary Embodiment 6

Figure 7:
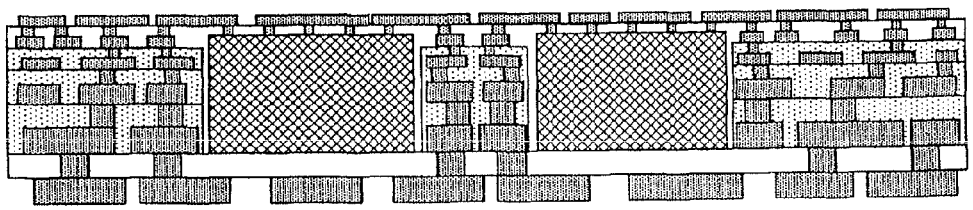
FIG. 7 is a schematic cross-sectional view showing an exemplary embodiment.

Further, as shown in FIG. 7, in the present invention, a plurality of functional elements may be provided. FIG. 7 shows a functional element built-in substrate in which two functional elements are embedded. This configuration is preferred because the function of the functional element built-in substrate is improved.

Exemplary Embodiment 7

Figure 8:
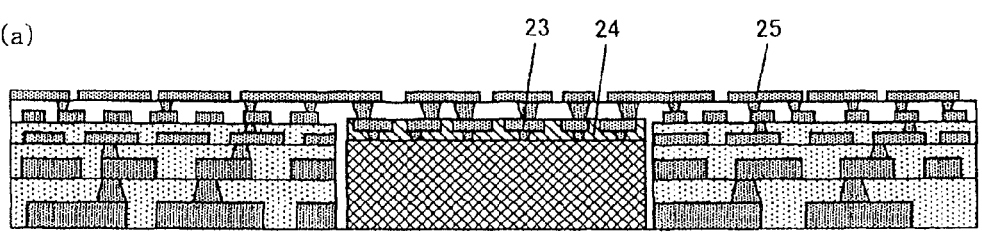
FIG. 8 is a schematic cross-sectional view showing an exemplary embodiment.
Figure 8:
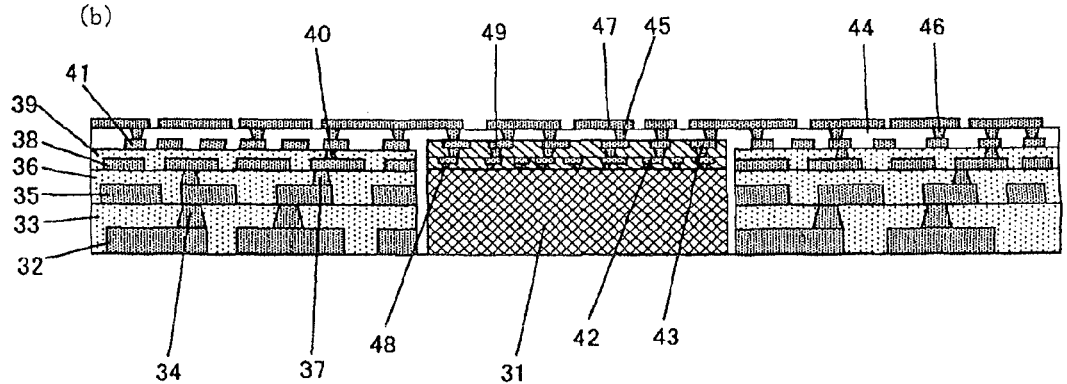

Further, as shown in FIG. 8(a), it is possible to provide a rewiring structure layer having a role of enabling wiring design of expansion, and the like, of the electrode pitch of a functional element, such as an LSI chip. The rewiring structure layer is formed on the functional element 1 and can be formed to include one or more rewiring layers. In FIG. 8(a), the rewiring structure layer is formed by one rewiring insulating layer which includes at least an insulating layer 24 and a rewiring layer including a rewiring 23. Further, second electrode terminals can be provided on the outermost surface side (uppermost layer side) of the rewiring structure layer.

A forming method of the rewiring structure layer is disclosed, for example, in JP2006-32600A or JP2009-194022A. For example, the rewiring structure layer can be formed in such a manner that a plurality of layers are formed on the surface of a semiconductor chip circuit by using a photolithographic method.

As described above, a plurality of rewiring layers can be provided in the rewiring structure layer, and it is preferred that, in any pair of the rewiring insulating layers which are included in the rewiring structure layer and that are in contact with each other, the cross-sectional shape of each of the rewiring insulating layers, which cross-sectional shape is taken along the plane perpendicular to the extension direction of the rewiring in the rewiring insulating layer, has a relationship that the cross-sectional area of the front surface side rewiring insulating layer (upper side) is larger than the cross-sectional area of the back surface side rewiring insulating layer (lower side). That is, it is preferred that the cross-sectional area of the rewiring is increased for each of the rewiring insulating layers from the circuit surface of the functional element to the front surface side of the rewiring structure layer (to the side of the upper wiring layer in FIG. 8). The cross-sectional area of the rewiring means the area of the cross-sectional shape along the plane perpendicular to the extension direction of the rewiring.

Further, it is more preferred that the cross-sectional shape of the rewiring and of the wiring is enlarged in the order of the rewiring layer, the upper wiring layer, and the wiring substrate. Examples of such configuration include the configuration shown in FIG. 8(b). More specifically, it is preferred that the cross-sectional area of the rewiring included in the rewiring insulating layer on the outermost surface side is smaller than the cross-sectional area of the upper wiring in the upper wiring layer close to the rewiring insulating layer, and that the cross-sectional area of the upper wiring included in the upper wiring layer close to the rewiring insulating layer on the outermost surface side is smaller than the cross-sectional area of the wiring included in the wiring insulating layer on the outermost surface side. With this configuration, a fan out configuration between the electrode terminals of the functional element and the back surface side of the wiring substrate can be more effectively achieved by using the rewiring layer and the upper wiring layer.

In FIG. 8(b), the rewiring structure layer including the rewiring layer A including a first rewiring 42 and the rewiring layer B including a second rewiring 43 is formed on the circuit surface of the functional element. On the rewiring structure layer, post electrodes 45 are provided as electrode terminals.

A functional element 31 is embedded in a structure formed by laminating a plurality of insulating layers. Further, vias or wirings are formed in each of the insulating layers. First wirings 32 and first vias 34 are formed in a first insulating layer 33 which is the lowermost layer. Further, second wirings 35 and second vias 37 are formed in a second insulating layer 36 formed on the first insulating layer 33. Further, third wirings 38 and third vias 40 are formed in a third insulating layer 39 formed on the second insulating layer 36. Fourth wirings 41 are formed on the third insulating layer 36.

The post electrodes 45 and the fourth wirings 41 are electrically connected to each other via upper wirings 47 and upper vias 46. The upper vias 46 are formed in an insulating material 44, and the insulating material 44 is also arranged in the gap between the functional element 31 and the wiring substrate.

Here, the cross-sectional area of the rewiring, the upper wiring, and the wiring is increased in the order of the rewiring 42, the rewiring 43, the upper wiring 47, the fourth wiring 41, the third wiring 38, the second wiring 35, and the first wiring 32. With this configuration, change in the wiring shape at each of the boundary surfaces can be suppressed to be small, so that signal reflection can be further reduced, and signal quality can be further improved.

Further, as a more preferred form, it is preferred that the cross-sectional shape of the vias is increased in the order of rewiring vias 48, rewiring vias 49, the post electrodes 45, the upper vias 46, the third vias 40, the second vias 37, and the first vias 34.

For example, in the case where a CMOS is used as the functional element, it is possible that the pitch of the CMOS layer is set to 10 to 100 nm, that the pitch of the upper wiring layer is set to 3 to 50 μm, and that the pitch of external connection terminals, such as BGA terminals, provided on the back surface of the functional element built-in substrate, is set to 50 to 1000 μm.

Further, the electrode terminals on the rewiring layer can also be electrically connected to the wirings on the front surface side of the wiring substrate by using wires, the other wiring substrate, the other functional element, or the like, other than the upper wiring layer.

Exemplary Embodiment 8

Further, as described above, the front surface side of the functional element 1 can be electrically connected to the front surface side of the wiring substrate by wires. In this case, the wiring of the outermost surface layer of the wiring substrate can be further fined, and hence the wiring containing rate can be improved. Further, the wirings of the first upper wiring 11 can also be fined, and hence the wiring containing rate can be improved.

Exemplary Embodiment 9

Further, as described above, the front surface side of the functional element 1 and the front surface side of the wiring substrate can be electrically connected to each other by the other wiring substrate. In this case, a multilayer wiring can be easily provided on the functional element 1 and the wiring substrate, and hence it is possible to simultaneously achieve the improvement in the wiring containing rate and the reduction of cost. That is, the functional element built-in substrate can be configured by including, above the functional element and the wiring substrate, the other wiring substrate, through which the electrode terminals of the functional element are electrically connected to the wirings on the front surface side of the wiring substrate.

For example, a solder ball can be used to connect the front surface side of the functional element 1 to the other wiring substrate, and the front surface side of the wiring substrate is also similarly connected to the other wiring substrate.

Exemplary Embodiment 10

Further, as described above, the front surface side of the functional element 1 can be electrically connected to the front surface side of the wiring substrate by the other functional element. In this case, the function of the whole functional element built-in substrate can be improved.

As the other functional element, for example, a memory element, such as DRAM and SRAM, an imaging element, such as a CMOS image sensor and a CCD imaging sensor, a photo-electric conversion element, an electric-photo conversion element, or the like, can be preferably used, but the other functional element is not limited in particular to these.

For example, a solder ball can be used to connect the front surface side of the functional element 1 to the other functional element.

Exemplary Embodiment 11

Next, an exemplary embodiment of a manufacturing method of the functional element will be described with reference to the drawings.

Figure 9:
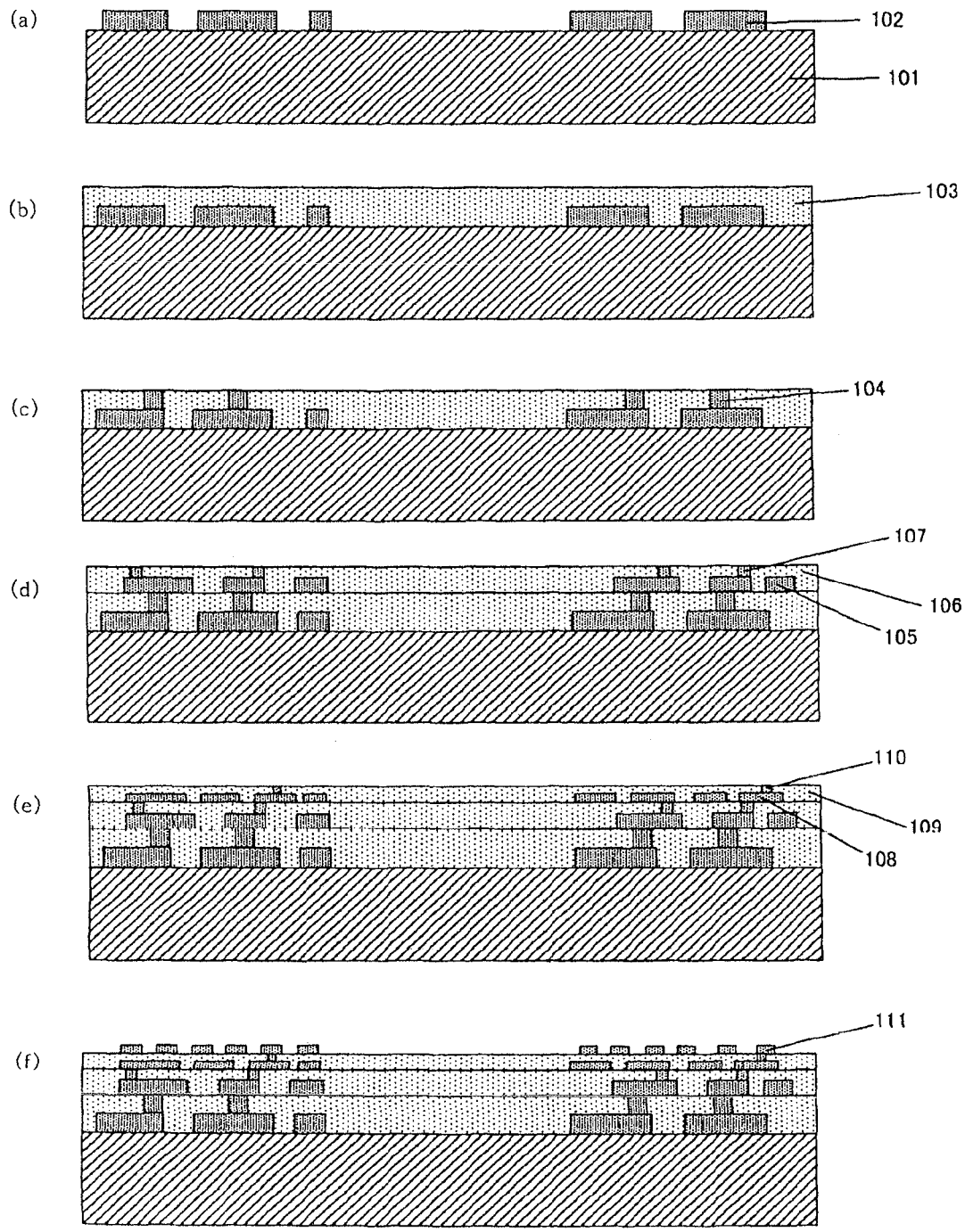
FIG. 9 is a series of cross-sectional process views for explaining a manufacturing method of a functional element built-in substrate according to the present invention.

First, as shown in FIG. 9(a), a support plate 101 is prepared, and a first wiring 102 is formed.

A conductive material or a material on the surface of which a conductive film is formed can be used as the support plate 101, and the material preferably has adequate rigidity. As the material of the support plate 101, for example, a semiconductor wafer material, such as silicon and GaAs, metal, quartz, glass, ceramics, a printed circuit board, or the like, can be used. Wet washing, dry washing, flattening, roughening, and the like, can be applied to the surface of the support plate 101. In the exemplary embodiment, a Si wafer having a thickness of, for example, 0.625 mm can be used as the support plate.

The wirings can be formed by a wiring forming method such as, for example, a subtractive method, a semi-additive method, or a full-additive method, using a metal such as, for example, Cu, Ni, Sn, or Au.

The subtractive method is disclosed, for example, in JP 10-51105A. The subtractive method is a method in which a resist obtained by forming, into a desired pattern, a copper foil provided on a substrate or resin is used an etching mask, and in which a desired wiring pattern is obtained by removing the resist after etching.

The semi-additive method is disclosed, for example, in JP9-64493A. The semi-additive method is a method in which a resist is formed into a desired pattern after a feeding layer is formed, and in which a desired wiring pattern is obtained by depositing a metal in the resist opening section by electrolytic plating and then etching the feeding layer after removing the resist. The feeding layer can be formed, for example, by an electroless plating, a sputtering method, a CVD method, or the like.

The full-additive method is disclosed, for example, in JP6-334334A. In the full-additive method, first, a pattern is formed by a resist after an electroless plating catalyst is made to adhere to the surface of a substrate or the surface of resin. Then, a desired wiring pattern is obtained in such a manner that the catalyst is activated in the state where the resist is left as an insulating layer, and that a metal is deposited in the opening section of the insulating layer by the electroless plating method.

An adhesive layer (not shown) may be provided between the support plate 101 and the first wiring 102. Peeling of the first wiring 102 can be suppressed by providing the adhesive layer. As the adhesive layer, a layer having an adhesive force with respect to the materials of the support plate 101 and of the wiring can be used. Examples of the material of the adhesive layer include titanium, tungsten, nickel, tantalum, vanadium, chromium, molybdenum, copper, aluminum, or an alloy of these materials. Among these, titanium, tungsten, tantalum, chromium, molybdenum, or an alloy of these materials are preferred. Further, titanium, tungsten, or an alloy of these materials is more preferred. Further, the surface of the support plate 101 may be a roughened surface having fine depressions and projections. In this case, preferred adhesive force can be easily obtained even in the case where the wiring is made of copper or aluminum. Further, examples of means for increasing the adhesive force preferably include a method of forming the wiring by using a sputtering method.

It is preferred that the thickness of the first wiring 102 is set to, for example, 3 to 40 μm, and preferably set to 5 to 20 μm. When the thickness of the first wiring 102 is set to 3 μm or more, the wiring resistance is reduced, so that electrical characteristics in a power source circuit of a semiconductor device can be further improved. When the thickness of the first wiring 102 is set to 20 μm or less, the undulation with depressions and projections of the wiring is hardly generated on the surface of the insulating layer covering the wiring, so that the number of laminated layers can be increased and also the insulating layer can be easily formed under restrictions on the process. Further, each of the line width and the space width of the first wiring is preferably set to, but not limited to, about the thickness or more of the first wiring.

In the exemplary embodiment, a Cu wiring having a thickness of 20 μm is formed, for example, by a semi-additive method, so that both the line width and the space width can be set to 20 μm. Further, an alloy layer made of titanium and tungsten can be used as the adhesive layer.

Next, as shown in FIG. 9(b), a first insulating layer 103 is formed.

The insulating layer has insulating properties and can be formed of, for example, an organic material. Examples of the organic material include epoxy resin, epoxyacrylate resin, urethane acrylate resin, polyester resin, phenol resin, polyimide resin, BCB (Benzocyclobutene), PBO (Polybenzoxazole), poly norbornene resin, and the like. Among these material, polyimide resin or PBO is excellent in mechanical properties, such as film strength, tensile elastic modulus, and breaking elongation rate, and hence enables high reliability to be obtained. Any of photosensitive and non-photosensitive organic materials may be used.

Any of a vacuum lamination method, a vacuum press method, a spin coating method, and the like, is preferred as a forming method of the insulating layer, but the forming method is not limited to these methods. In the case of the vacuum lamination method, a sheet shaped resin in an uncured state is laminated by using a vacuum laminator apparatus, and is then cured by application of heat. In the case of the vacuum press method, a sheet shaped resin in a semi-cured state is laminated and cured while being pressed and heated in a vacuum press apparatus. In the case of the spin coating method, a varnish-like resin is applied and dried by a spin coater apparatus. Thereafter, when the resin is a photosensitive resin, the resin is exposed and developed, and is then cured by application of heat.

The thickness of the first insulating layer 103 is preferably set to, but not limited to, about twice the thickness of the first wiring 2. It is preferred to select an appropriate thickness of the first insulating layer 103 because, when the thickness of the insulating layer is too large, the impedance of interlayer vias may be increased, and because, when the thickness of the insulating layer is too small, the insulating properties may not be maintained.

Further, the insulating layer may contain a reinforcing material. For example, a woven fabric can be used as the reinforcing material. The woven fabric can reduce a difference of thermal expansion coefficient between the insulating layer and the functional element embedded in the insulating layer, and also can improve the rigidity of the insulating layer even when the insulating layer has a small thickness. For example, glass fiber or organic material fiber is used as the reinforcing material. As the organic material fiber, for example, polyimide, polyamide, PBO, liquid crystal polymer, fluorine-based resin, and the like, are suitable in terms of rigidity and thickness reduction, and glass fiber is more preferred from the viewpoint of cost and thermal expansion coefficient. In the insulating layer containing the reinforcing material, the opening section of the via can be formed by a laser method, a dry etching method, a blast method, or the like.

In the exemplary embodiment, for example, an epoxy resin, which has a thickness of 40 μm and in which a woven fabric made of glass fiber is impregnated, can be laminated by the vacuum lamination method.

Next, as shown in FIG. 9(c), first vias 104 are formed.

When a photosensitive organic material is used for the insulating layer, the opening section of the via can be formed by a photolithography method, or the like. When a non-photosensitive material or a photosensitive organic material having a low pattern resolution is used for the insulating layer, the via opening section can be formed by a laser method, a dry etching method, a blast method, or the like.

The material of the via is not limited in particular as long as the material has conductive property. For example, a soldering material, and a conductive resin paste containing a thermosetting resin and conductive metal powder, such as copper and silver, can be used as the material of the via. It is preferred to use, as the conductive resin paste, a paste material containing nano-particles as conductive particles. Further, it is more preferred to use, as the conductive resin paste, a material containing a volatile resin component, or a material containing a resin component which sublimates when the material is heated and brought close to a sintered body. More preferably, stable and rigid vias are provided by a vapor deposition method, a sputtering method, a CVD (Chemical Vapor Deposition) method, an ALD (Atomic Layer Deposition) method, an electroless plating method, an electrolytic plating method, or the like. Examples of the manufacturing method of the vias include a method in which a feeding layer is provided by a vapor deposition method, a sputtering method, a CVD method, an ALD method, an electroless plating, or the like, and in which the vias are then formed to have a desired thickness by an electrolytic plating method or an electroless plating method. Further, the opening diameter of the vias is preferably set to, but not limited to, a value approximately equal to the thickness of the vias.

In the exemplary embodiment, it is possible that, after an opening section is formed by a laser method, a feeding layer made of Ti and Cu is provided by a sputtering method, and then vias each having a film thickness of 20 μm and a (top side) diameter of 20 μm are formed by an electrolytic plating method (semi-additive method) using Cu.

Next, as shown in FIG. 9(d), second wirings 105, a second insulating layer 106, and second vias 107 are formed.

The second wirings 105, the second insulating layer 106, and the second vias 107 can be formed by the above-described methods.

In the exemplary embodiment, the second wiring 105 can be formed, for example, by the Cu electrolytic plating method (semi-additive method) using the feeding layer formed by the sputtering method using Ti and Cu. Further, for example, the thickness of the second wiring 105 can be set to 10 μm, and the line width and the space width of the second wiring 105 can be set to 10 μm, respectively. Further, the second insulating layer 106 can be formed of, for example, an epoxy resin containing no woven fabric, so as to have a thickness of 20 μm. Further, the second via 107 can be formed by the Cu electrolytic plating method so that the film thickness and the (top side) diameter thereof are set to 10 μm, respectively.

Next, as shown in FIG. 9(e), third wirings 108, a third insulating layer 109, and third vias 110 are formed.

The third wirings 108, the third insulating layer 109, and the third vias 110 can be formed by the above-described methods.

In the exemplary embodiment, the third wiring 108 can be formed, for example, by the Cu electrolytic plating method (semi-additive method) using the feeding layer formed by the sputtering method using Ti and Cu. Further, for example, the thickness of the third wiring 108 can be set to 7 μm, and the line width and the space width of the third wiring 108 can be set to 7 μm, respectively. Further, the third insulating layer 109 can be formed of, for example, an epoxy resin containing no woven fabric, so as to have a thickness of 14 μm. Further, the third via 110 can be formed, for example, by the Cu electrolytic plating method, so that the film thickness and the diameter thereof are set to 7 μm, respectively.

Next, as shown in FIG. 9(f), fourth wirings 111 are formed.

The fourth wiring 111 can be formed by using the above-described forming methods. A land may be formed as the fourth wiring 111.

Note that, in the exemplary embodiment, the fourth wiring 111 can be formed, for example, by the Cu electrolytic plating method (semi-additive method) using the feeding layer formed by the sputtering method using Ti and Cu. The thickness of the fourth wiring 111 can be set to 5 μm, and the line width and the space width of the fourth wiring 111 can be set to 5 μm, respectively.

Here, there is also a case where the first insulating layer 103, the second insulating layer 106, and the third insulating layer 109 are regarded as one layer and are described as an insulating layer.

Figure 10:
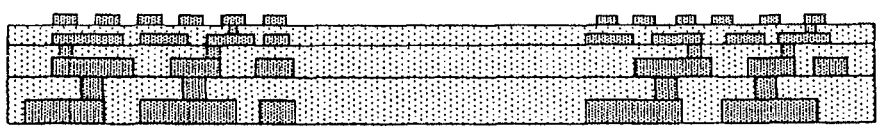
FIG. 10 is a series of cross-sectional process views for explaining the manufacturing method of the functional element built-in substrate according to the present invention, subsequently to FIG. 9(f).
Figure 10:

Next, as shown in FIG. 10(a), the support plate 101 is removed.

For example, a wet etching method, a dry etching method, a grinding method, or the like, can be used as the removing method of the support plate 101. Further, the supporting body 101 may be exfoliated and removed in the case where portions which can be easily exfoliated are provided in a low density form on the supporting body 101. Further, processing by the wet etching method, the dry etching method, the polishing method or the like, may be performed after the exfoliation.

In the exemplary embodiment, the supporting body made of Si can be removed, for example, by a combination of the polishing method and the wet etching method.

Next, as shown in FIG. 10(b), an opening section 112 for arranging a functional element is formed.

The forming method of the opening section 112 is not limited in particular, but for example, die-cutting using a pressing machine, a laser method, or the like, is preferably used as the forming method of the opening section 112.

In the exemplary embodiment, for example, die cutting using a pressing machine can be used.

In the following, the insulating layers 103, 106 and 109 and the wirings 102, 105, 108 and 111, and the vias 104, 107 and 110 are regarded as one body, and are also described as the wiring substrate A. In the present invention, the wiring substrate includes the opening section in which a functional element having electrode terminals on the front surface side thereof is embedded, and also includes a structure formed by laminating a plurality of insulating layers each of which includes at least one of the wiring and the via. Further, the front surface side and the back surface side of the wiring substrate are electrically connected to each other via at least the wiring and the via. Further, in a pair of the wiring insulating layers which are included in the laminated structure and that are in contact with each other, the cross-sectional shape of each of the wiring insulating layers, which cross-sectional shape is taken along the plane perpendicular to the extension direction of the wiring in the wiring insulating layer, has a relationship that the cross-sectional area of the back surface side wiring insulating layer is larger than the cross-sectional area of the front surface side wiring insulating layer. More preferably, in any pair of the wiring insulating layers which are included in the laminated structure and that are in contact with each other, the cross-sectional shape of the wiring in each of the wiring insulating layers has a relationship that the cross-sectional area of the wiring in the back surface side wiring insulating layer is larger than the cross-sectional area of the wiring in the front surface side wiring insulating layer. That is, it is preferred that, at least in the side surface region of the opening section, the cross-sectional shape of the wiring is increased for each of the wiring insulating layers from the front surface side to the back surface side of the wiring substrate. The wiring substrate needs only to have such structure, and wiring layers and electrode terminals may be further provided on the back surface of the structure.

Figure 11:
FIG. 11 is a series of cross-sectional process views for explaining the manufacturing method of the functional element built-in substrate according to the present invention, subsequently to FIG. 10(b).
Figure 11:
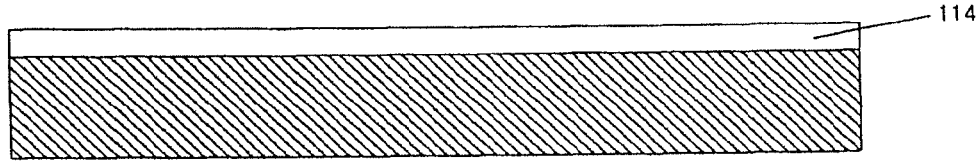
Figure 11:
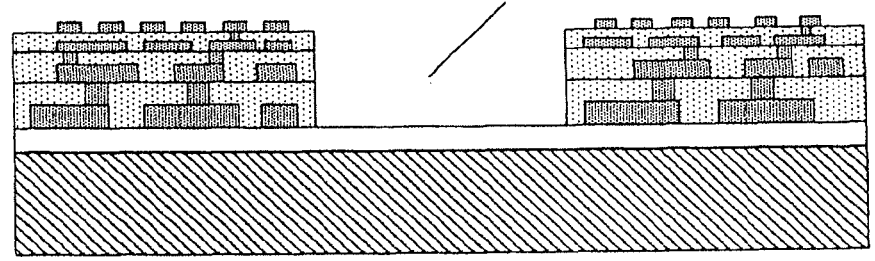
Figure 11:
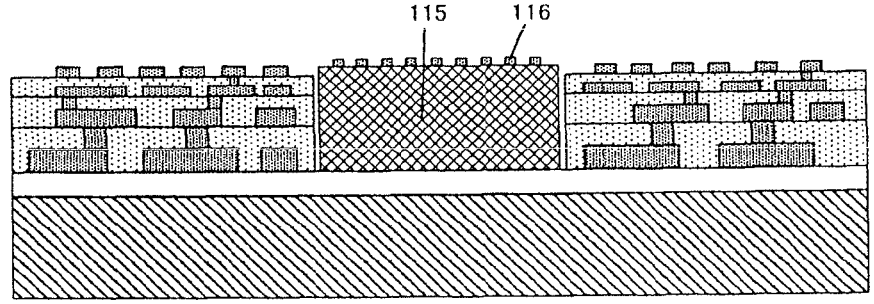

Next, as shown in FIG. 11(a), a support plate 113 is prepared. In the exemplary embodiment, a Si wafer having a thickness of, for example, 0.625 mm can be used as the support plate 113.

Next, as shown in FIG. 11(b), a lower insulating layer 114 is formed on the supporting body 113. The lower insulating layer 114 can be formed by the above-described insulating layer forming method.

In the exemplary embodiment, for example, an epoxy resin film having a thickness of 20 μm can be laminated by the vacuum lamination method.

Next, as shown in FIG. 11(b), the wiring substrate A is installed on the lower insulating layer 114.

When a desired adhesive function is provided for adhesion of the wiring substrate A at a time such as a time before the lower insulating layer 114 is cured, the wiring substrate A is made to adhere to the lower insulating layer 114 as it is. Further, particularly when the adhesive function is not provided or is unstable, a liquid or sheet-like adhesive may be used. For example, epoxy resin, epoxyacrylate resin, urethane acrylate resin, polyester resin, phenol resin, polyimide resin, or the like, can be used as the adhesive.

In the exemplary embodiment, it is possible, for example, that the wiring substrate A is installed so as to adhere to the cured lower insulating layer 114 with an epoxy-based adhesive having a thickness of 20 μm.

Next, as shown in FIG. 11(d), a functional element 115 is installed in the opening section 112 of the wiring substrate A. The functional element 115 can be installed, for example, by adhesion. The adhesion can be performed similarly to the adhesion method of the wiring substrate A.

Further, as shown in FIG. 11(d), electrode terminals 116, such as post electrodes, may be provided on the functional element 115. It is preferred that the electrode terminal 116 is provided with a stable and rigid connection section. Specifically, the electrode terminals are provided by, for example, a vapor deposition method, a sputtering method, a CVD (Chemical Vapor Deposition) method, an ALD (Atomic Layer Deposition) method, an electroless plating method, an electrolytic plating method, or the like. Examples of the manufacturing method of the electrode terminal include a method (semi-additive method) in which a feeding layer is first provided by the vapor deposition method, the sputtering method, the CVD method, the ALD method, the electroless plating method, or the like, and in which the electrode terminal having a desired thickness is then formed by the electrolytic plating method or the electroless plating.

Further, although not shown, a rewiring structure layer can be provided on the functional element 115, and the electrode terminals 116 may also be provided on the rewiring structure layer.

Further, it is preferred that the functional element 115 is formed to be thin so as to reduce the thickness of the functional element built-in substrate. The thickness of the functional element is set, for example, to 300 μm or less, and preferably to 150 μm or less, and is more preferably set to 100 μm or less. As the functional element, a semiconductor element is preferably used.

In the exemplary embodiment, for example, a copper post having a height of 10 μm can be provided, as the electrode terminal 116, on the surface of the functional element 115 having a thickness of 50 μm by using the electrolytic plating method. By using an epoxy-based adhesive having a thickness of 20 μm, the functional element 115 can be installed on the lower insulating layer 114 subjected to curing processing.

Figure 12:
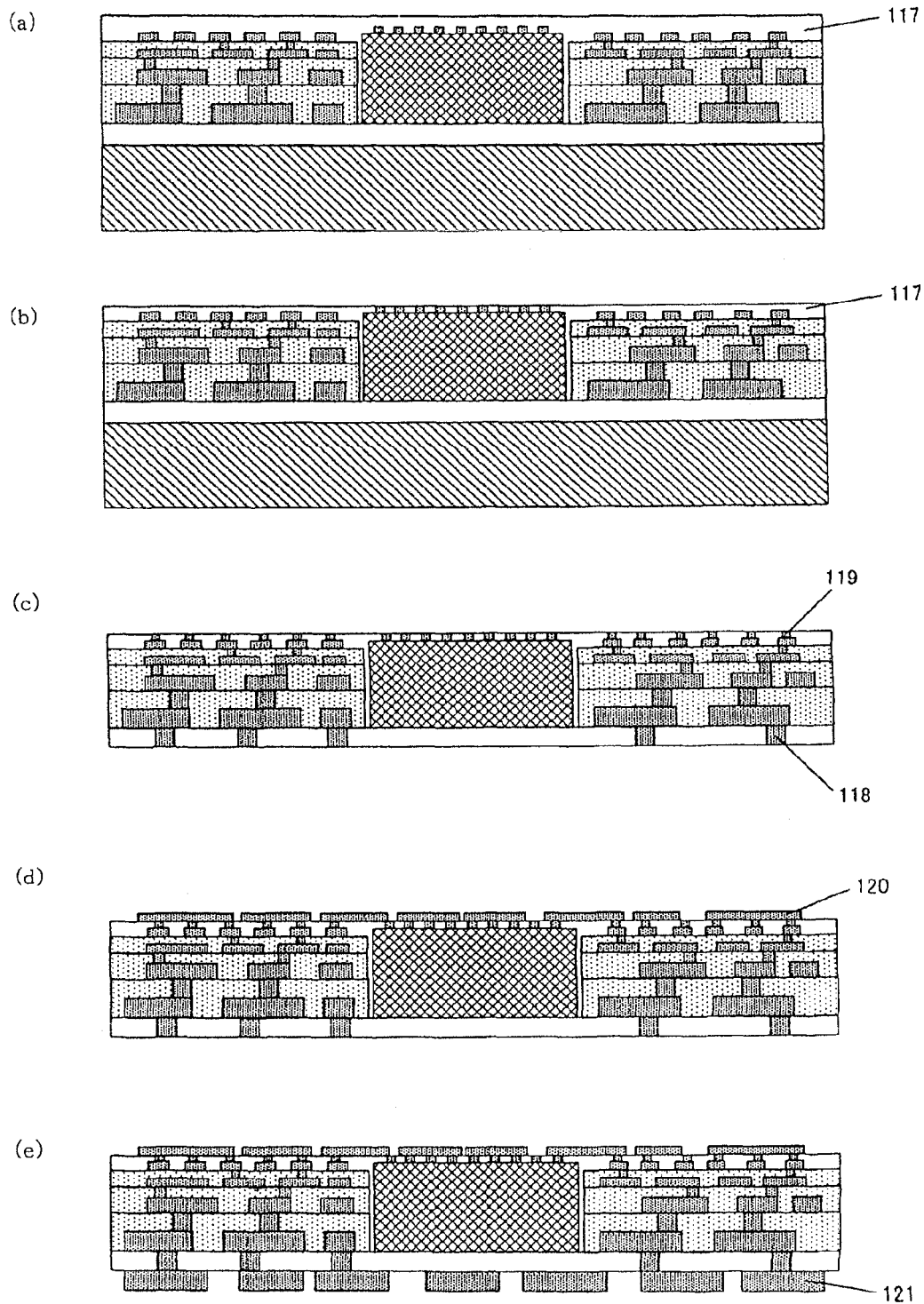
FIG. 12 is a series of cross-sectional process views for explaining the manufacturing method of the functional element built-in substrate according to the present invention, subsequently to FIG. 11(d).

Next, as shown in FIG. 12(a), an upper insulating layer 117 is formed on the wiring substrate A and the functional element 115.

The upper insulating layer 117 can be formed by the same forming method as the forming method of the above-described insulating layer. The vacuum lamination method is preferably used so that a resin used to form the upper insulating layer 117 is made to easily enter the gap between the functional element 115 and the wiring substrate A, but the forming method is not limited to this.

In the exemplary embodiment, the upper insulating layer 117 can be formed, for example, by laminating an epoxy resin film having a thickness of 20 μm by the vacuum lamination method.

Next, as shown in FIG. 12(b), the surface of the upper insulating layer 117 is ground, and the electrode terminal 116 is exposed. When the electrode terminal 116 is not formed, this process need not be performed.

Examples of the grinding method include a buff polishing method, a CMP method, and the like.

In the exemplary embodiment, the upper insulating layer 117 can be polished by using, for example, the buff polishing method so that the distance between the upper surface of the fourth wiring 111 and the surface of the upper insulating layer 117 becomes about 5 μm.

Next, as shown in FIG. 12(c), the supporting body 113 is removed.

Examples of the removing method of the supporting body 113 can include a wet etching method, a dry etching method, a polishing method, and the like. Further, the supporting body 113 may also be removed by exfoliation, and after the exfoliation, the wet etching method, the dry etching method, the polishing method, or the like, may be performed.

In the exemplary embodiment, the supporting body made of Si can be removed, for example, by a combination of the polishing method and the wet etching method.

Further, as shown in FIG. 12(c), upper vias 119 and lower vias 118 are formed in the upper insulating layer 117 and the lower insulating layer 114, respectively. The upper vias 119 and the lower vias 118 can be formed by the above-described via forming method. Further, it is preferred that the opening diameter of the via is approximately equal to the film thickness of the via, but the opening diameter of the via is not limited to this. Note that, when the electrode terminal 116 is not provided, the upper via can include a via which penetrates from the circuit surface of the functional element to the surface of the upper insulating layer 117. That is, the upper via can also be formed on the circuit surface of the functional element.

In the exemplary embodiment, it is possible, for example, that, after the opening section is formed by the laser method, a feeding layer made of Ti and Cu is provided by the sputtering method, and the upper via and the lower via are formed by the electrolytic plating method (semi-additive method) using Cu. Further, for example, the lower via 118 can be formed to have a film thickness of 20 μm and a diameter of 20 μm, and the upper via 119 can be formed to have a the film thickness of 5 μm and a diameter of 5 μm.

Next, as shown in FIG. 12(d), upper wirings 120 are formed on the upper insulating layer 117 in which the upper vias 119 are formed. Further, as shown in FIG. 12(e), lower wirings 121 are formed under the lower insulating layer 114 in which the lower vias 118 are formed.

Note that, in the exemplary embodiment, the upper wirings 120, the upper vias 119, and the upper insulating layer 117 can be regarded as an upper wiring layer. In this case, there is no problem in particular even when the fourth wiring 111 is regarded to be included in the upper wiring layer. The upper wiring layer is a layer which has at least a role of electrically connecting the front surface side (circuit formation surface) of the functional element to the front surface side of the wiring substrate.

The lower wirings 121 and the upper wirings 120 can be formed similarly by the wiring forming method described above.

Note that, in the exemplary embodiment, Cu wirings can be formed as the lower wiring 121 and the upper wiring 120, for example, by the semi-additive method. For example, the upper wiring 120 can be formed to have a line width and the space width of 5 μm respectively and a thickness of 20 μm. Further, for example, the lower wiring 121 can be formed to have a line width and the space width of 20 μm respectively and a thickness of 20 μm.

Further, the exemplary embodiment is configured such that the front surface side (circuit formation surface) of the functional element and the front surface side of the wiring substrate are electrically connected by the upper wiring layer 120, but the configuration is not limited to this. For example, the front surface side of the functional element and the front surface side of the wiring substrate may be electrically connected by using wires, the other wiring substrate, the other functional element, or the like.

When the front surface side of the functional element and the front surface side of the wiring substrate are electrically connected by using wires, it is possible that, after the upper insulating layer 117 and the upper vias 119 are provided, lands are provided instead of the upper wiring layer 120 shown in FIG. 12(d), and that wires are then mounted on the lands by using solder, or the like. As a material of the wire, Au, Cu, and the like, are preferred, but the material of the wire is not limited to these.

When the front surface side of the functional element and the front surface side of the wiring substrate are electrically connected by using the other wiring substrate, it is possible that, after the upper insulating layer 117 and the upper vias 119 are provided, lands are provided instead of the upper wiring layer 120 shown in FIG. 12(d), and that the other wiring substrate is then mounted on the lands by using BGA, or the like.

When the front surface side of the functional element and the front surface side of the wiring substrate are electrically connected to each other by using the other functional element, it is possible that, after the upper insulating layer 117 and the upper vias 119 are formed, lands are provided instead of the upper wiring layer 120 shown in FIG. 12(d), and that the other functional element is then mounted on the lands by using BGA, or the like.

As described above, the functional element built-in substrate according to the present invention can be manufactured. Note that the exemplary embodiment represents a form including the lower vias 118 and the lower wirings 121, but is not limited to this form.

Exemplary Embodiment 12

In the exemplary embodiment, there will be described a manufacturing method in which the insulating layer is formed by gradually enlarging the cross-sectional shape of the wiring from the layer near the electrode terminals of the functional element to be arranged (from the layer on the front surface side of the wiring substrate). Further, as a more preferred form, a form will be described in which, as the cross-sectional shape of the wiring and the cross-sectional shape of the via are enlarged, the thickness of the insulating layer is also increased, and in which the via is formed so that its back surface side diameter is larger than its front surface diameter.

In the following, the exemplary embodiment will be described with reference to the accompanying drawings.

Figure 13:
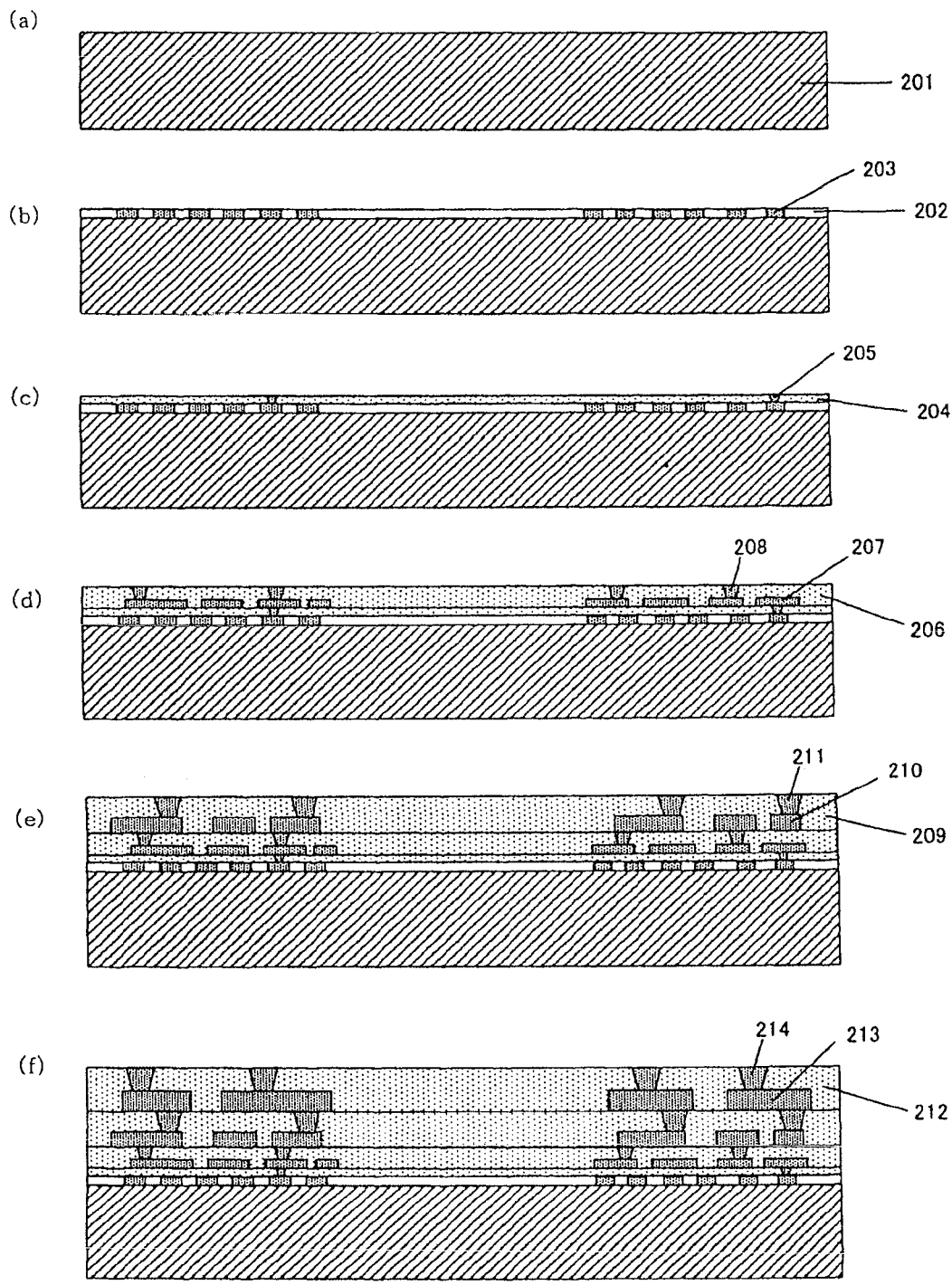
FIG. 13 is a series of cross-sectional process views for explaining a manufacturing method of a functional element built-in substrate according to the present invention.

First, as shown in FIG. 13(a), a support plate 201 is prepared. Next, as shown in FIG. 13(b), an upper insulating layer 202 is formed on the support plate 201, and a first upper wiring 203 is formed.

In the exemplary embodiment, a Si wafer having a thickness of, for example, 0.625 mm can be used as the support plate.

In the exemplary embodiment, the first upper wiring 203 can be formed to have, for example, a thickness of 5 µm, and line and space widths of 5 µm respectively.

Next, as shown in FIG. 13(c), an insulating layer A 204 is formed, and vias A 205 are formed. In this case, it is preferred that, after the insulating layer A is formed, the opening section of the via A is formed by a laser method. When the opening section is formed by the laser method, in the embodiment of the figure, the opening section is formed in a reversely tapered shape so that the diameter on the top side (lower side in the figure) of the via can be made smaller than the diameter on the bottom side (upper side in the figure) of the via. Thereby, a narrow pitch can be gradually shifted to a larger pitch, so that signal reflection can be further reduced and signal quality can be further improved.

The exemplary embodiment can be formed, for example, such that the thickness of the insulating layer A is 7 µm, such that the top diameter of the via A is 6 µm, and such that the bottom diameter of the via A is 8 µm.

Next, as shown in FIG. 13(d), an insulating layer B 206, wirings B 207, and vias B 208 are formed. For example, the wirings B 207 are first formed, and then the insulating layer B 206 is formed. Thereafter, via opening sections are provided by using the laser method, so that the vias B 208 can be formed.

The exemplary embodiment can be configured, for example, such that the thickness of the insulating layer B is 17 µm, such that the height of the via B is 10 µm, such that the top diameter of the via is 8 µm, such that the bottom diameter of the via is 12 µm, such that the height of the wiring B is 7 µm, and such that the line and space widths of the wiring B are both 7 µm.

Next, as shown in FIG. 13(e), insulating layer C 209, wirings C 210, and vias C 211 are formed. For example, the wirings C are first formed, and then the insulating layer C is formed. Thereafter, via opening sections are provided by using the laser method, so that the vias C can be formed.

The exemplary embodiment can be configured, for example, such that the thickness of the insulating layer C is 30 µm, such that the height of the via C is 20 µm, such that the top diameter of the via C is 17 µm, such that the bottom diameter of the via C is 23 µm, such that the height of the wiring C is 10 µm, and such that the line and space widths of the wiring C are both 10 µm.

Next, as shown in FIG. 13(f), an insulating layer D 212, wirings D 213, and vias D 214 are formed. For example, the wirings D are first formed, and then the insulating layer D is formed. Thereafter, via opening sections are provided by using the laser method, so that the vias D can be formed.

The exemplary embodiment can be configured, for example, such that the thickness of the insulating layer D is 45 µm, such that the height of the via D is 25 µm, such that the top diameter of the via D is 21 µm, such that the bottom diameter of the via D is 29 µm, such that the height of the wiring D is 20 µm, and such that the line and space widths of the wiring D are both 20 µm.

Figure 14:
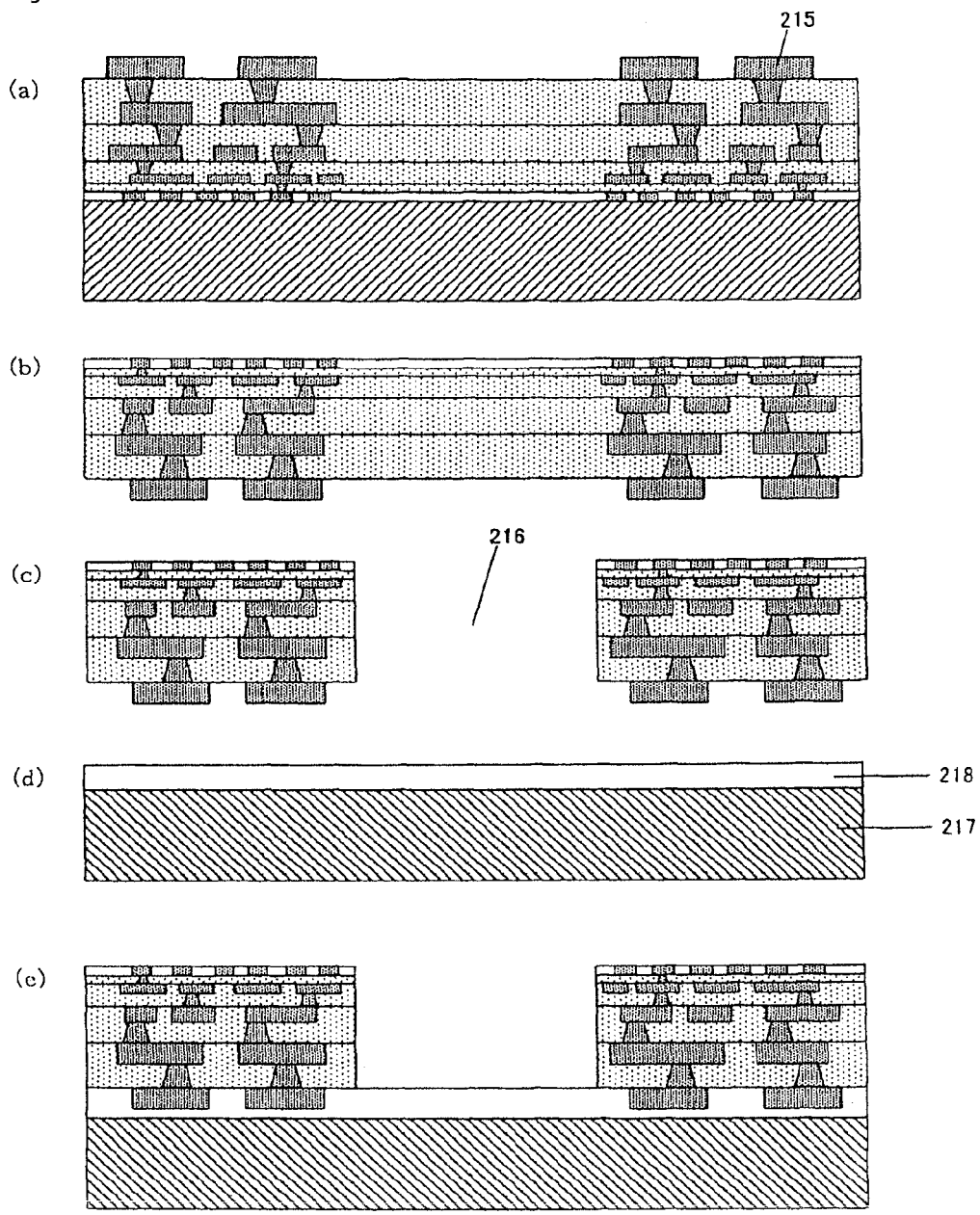
FIG. 14 is a series of cross-sectional process views for explaining the manufacturing method of the functional element built-in substrate according to the present invention, subsequently to FIG. 13(f).

Next, as shown in FIG. 14(a), lower wirings 215 are formed.

Next, as shown in FIG. 14(b), the support plate 201 is removed.

Next, as shown in FIG. 14(c), an opening section 216 for arranging a functional element is formed, and a wiring substrate B is obtained.

Next, as shown in FIG. 14(d), a support plate 217 is prepared, and a lower insulating layer 218 is formed on the support plate 217.

Next, as shown in FIG. 14(e), the wiring substrate B is installed on the lower insulating layer 218. In this case, the wiring substrate B is installed on the lower insulating layer 218 while the wiring substrate B and the lower insulating layer 218 are heated so that the lower wirings 215 are embedded into the lower insulating layer 218.

Figure 15:
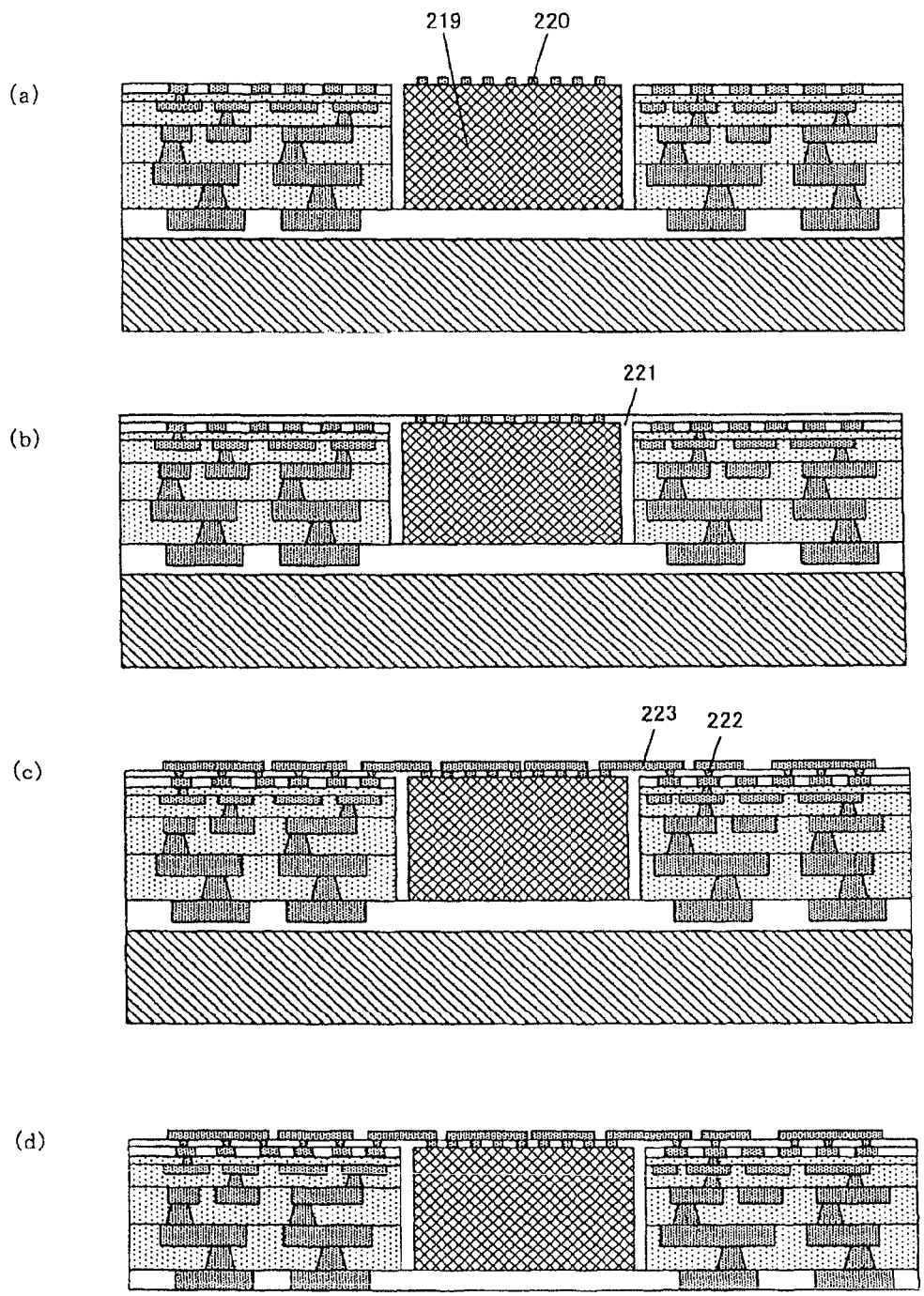
FIG. 15 is a series of cross-sectional process views for explaining the manufacturing method of the functional element built-in substrate according to the present invention, subsequently to FIG. 14(e).

Next, as shown in FIG. 15(a), a functional element 219 is installed in the opening section 216 of the wiring substrate B.

Further, as shown in FIG. 15(a), electrode terminals 220, such as post electrodes, are formed on the functional element 219.

Further, a semiconductor element is preferably used as the functional element 219, the thickness of which is set to, for example, 20 μm or more to 300 μm or less.

In the exemplary embodiment, for example a copper post having a height of 10 μm can be provided, as the electrode terminal 220, by electrolytic plating on the surface of the semiconductor element having a thickness of 50 μm.

Next, as shown in FIG. 15(b), an upper insulating layer 221 is formed on the wiring substrate B and the functional element 219. It is preferred to use the vacuum lamination method so that resin can easily enter the gap between the functional element 219 and the wiring substrate B. Further, the surface of the upper insulating layer 221 is ground, so that the electrode terminals 220 are exposed.

Next, as shown in FIG. 15(c), upper vias 222 are formed in the upper insulating layer 221, and second upper wirings 223 are formed on the upper vias 222. The front surface side of the wiring substrate and the front surface side of the functional element can be electrically connected to each other by the second upper wirings 223, the upper vias 222, and the first upper wirings 203.

Next, as shown in FIG. 15(d), the supporting body 113 is removed, and the lower insulating layer 218 is further removed by the polishing method, or the like, until the lower wirings 215 are exposed.

Although subsequent processes are not described in detail, wiring layers can be further provided on the upper surface or the lower surface. Further, the electrode terminals for external connection can also be provided on the upper surface or the lower surface.

From the layer close to the electrode terminals to the back surface on the side opposite to the layer, the exemplary embodiment can be configured such that the wiring rule is shifted from a narrow pitch and a narrow width to a wide pitch and a wide width, such that the diameter of the via is shifted from a small diameter to a large diameter, and such that the height of the via and the thickness of the insulating layer are shifted from small height and thickness to larger height and thickness.

Exemplary Embodiment 13

Another exemplary embodiment is a wiring substrate in which a functional element is embedded. That is, as described above, the wiring substrate according to the present invention includes an opening section in which a functional element is embedded, and a laminated structure which is formed at least in the side surface region of the opening section by laminating a plurality of wiring insulating layers each including a wiring. Further, the front surface side and the back surface side of the wiring substrate are electrically connected to each other at least via the wiring. Further, in a pair of the wiring insulating layers which are included in the laminated structure and that are in contact with each other, the cross-sectional shape of each of the wiring insulating layers, which cross-sectional shape is taken along the plane perpendicular to the extension direction of the wiring in the wiring insulating layer, is formed so that the cross-sectional area of the back surface side wiring insulating layer is larger than the cross-sectional area of the front surface side wiring insulating layer. More preferably, in any pair of the wiring insulating layers which are included in the laminated structure and that are in contact with each other, the cross-sectional shape of the wiring in each of the wiring insulating layers has a relationship that the cross-sectional area of the wiring in the back surface side wiring insulating layer is larger than the cross-sectional area of the wiring in the front surface side wiring insulating layer. That is, it is preferred that the cross-sectional shape of the wiring is enlarged for each of the wiring insulating layers from the front surface side to the back surface side of the wiring substrate. The wiring substrate according to the present invention can be used as a wiring substrate of various functional elements.

A functional element built-in substrate can be obtained by arranging and embedding a functional element in the opening section of the wiring substrate according to the present invention. In the wiring substrate according to the present invention, interlayer vias can be arranged at high density, and hence the via density around the functional element can be increased. In the wiring substrate according to the present invention, the front surface side (terminal side) of the functional element and the side opposite to the front surface side can be well connected to each other, and hence the wiring can be efficiently fanned out. Since, for the fan-out, a multilayer wiring need not be provided on the back side of the substrate, or since, even when a multilayer wiring is provided, the thickness of the multilayer wiring is reduced, the wiring substrate can be miniaturized.

Further, the wiring insulating layer includes a via which electrically connects between the wirings in the wiring insulating layers vertically in contact with each other. Similarly to the exemplary embodiments described above, it is preferred that the horizontal cross-section of the via is also increased for each of the wiring insulating layers from the front surface side to the back surface side of the wiring substrate.

Further, in the present invention, the wiring substrate has the above-described laminated structure in the side surface region of the functional element, but an insulating layer including only vias may be provided on the outermost surface or the lowermost surface of the laminated structure.

Also, the wiring substrate can further include a wiring layer on the back surface of the laminated structure.

Exemplary Embodiment 14

In the present invention, it is preferred that a photosensitive resin is adopted as an insulating layer which requires a small via diameter, a fine wiring rule, and a small thickness of the insulating layer. Further, it is preferred that a non-photosensitive resin, which enables a via to be formed by UV-YAG laser, is adopted for a layer having a middle degree of fineness. Further, it is preferred that a non-photosensitive resin, in which a reinforcing material, such as glass cloth, is impregnated and in which vias can be formed by $CO_2$ laser, is adopted for an insulating layer having a relatively large via diameter, a relaxed wiring rule, and a large thickness. Not only a high yield but also a low cost can be achieved by suitably adopting the insulating material and the process which are suitable for the wiring rule, the cross-sectional shape of the via, and the thickness of the insulating layer that are required for each of the insulating layers.

In the exemplary embodiment, examples of specific dimensions in the functional element built-in substrate shown in FIG. 12(d) or FIG. 12(e) are described. However, the present invention is not limited to these dimensions.

As the semiconductor element embedded in the functional element built-in substrate, a narrow-pitch multi-pin semiconductor element is used in which the pad pitch is set to 20 to 150 μm and in which the number of pins is set to 1000 to 2000. Further, as the metal post, a copper post having a diameter of 30 μm and a height of 15 μm is used. The thickness of the semiconductor element can be adjusted according to the thickness of a target semiconductor device. The thickness of the semiconductor element is set to 30 to 50 μm.

The thickness of the first insulating layer is 40 μm. The minimum wiring width and the minimum wiring interval of the first wiring are 20 μm, and the thickness of the first wiring is 20 μm. The first via has a top diameter of 15 μm, a bottom diameter of 25 μm, and a thickness of 20 μm.

The thickness of the second insulating layer is 20 μm. The minimum wiring width and the minimum wiring interval of the second wiring are 10 μm, and the thickness of the second wiring is 10 μm. The second via has a top diameter of 8 μm, a bottom diameter of 13 μm, and a thickness of 10 μm.

The thickness of the third insulating layer is 14 μm. The minimum wiring width and the minimum wiring interval of the third wiring are 7 μm, and the thickness of the third wiring is 7 μm. The third via has a top diameter of 6 μm, a bottom diameter of 10 μm, and a thickness of 7 μm.

The minimum wiring width and the minimum wiring interval of the fourth wiring are 5 μm, and the thickness of the fourth wiring is 5 μm. The upper via has a top diameter of 4 μm, a bottom diameter of 7 μm, and a thickness of 5 μm.

Exemplary Embodiment 15

In the exemplary embodiment, the UV laser method and the semi-additive method are respectively used for the formation of each of the pair of the upper via and the fourth wiring, the pair of the third wiring and the third via, and the pair of the second wiring and the second via. Further, the $CO_2$ laser method and the subtractive method are used for the formation of the first wiring and the first via. The subtractive method is substantially used for formation of a wiring having L/S=50/50 μm or more, and the additive method is used for formation of a wiring finer than the wiring. However, the application of the forming methods is not limited to these.

The thickness of the first insulating layer is 50 μm. The minimum wiring width and the minimum wiring interval of the first wiring are 25 μm, and the thickness of the first wiring is 25 μm. The first via has a top diameter of 25 μm, a bottom diameter of 40 μm, and a thickness of 25 μm.

The thickness of the second insulating layer is 40 μm. The minimum wiring width and the minimum wiring interval of the second wiring are 20 μm, and the thickness of the second wiring is 20 μm. The second via has a top diameter of 20 μm, a bottom diameter of 35 μm, and a thickness of 20 μm.

The thickness of the third insulating layer is 25 μm. The minimum wiring width and the minimum wiring interval of the third wiring are 12.5 μm, and the thickness of the third wiring is 12.5 μm. The third via has a top diameter of 12.5 μm, a bottom diameter of 20 μm, and a thickness of 12.5 μm.

The minimum wiring width and the minimum wiring interval of the fourth wiring are 5 μm, and the thickness of the fourth wiring is 5 μm. The upper via has a top diameter of 5 μm, a bottom diameter of 7 μm, and a thickness of 5 μm.

This application claims the benefit of priority from Japanese Patent Application No. 2010-012235 filed in Japan on Jan. 22, 2010, the entire content of which is hereby incorporated by reference in the application and claims of the present application.

In the above, the present invention has been described with reference to the exemplary embodiments, but the present invention is not limited to the exemplary embodiments. A configuration and details of the present invention may be modified in various ways within the scope of the present invention in a manner that a person skilled in the art can understand.

REFERENCE SIGNS LIST

1 Functional element
2 First wiring
3 First insulating layer
4 First via
5 Second wiring
6 Second insulating layer
7 Second via
8 Third wiring
9 Third insulating layer
10 Third via
11 First upper wiring (or Fourth wiring)
12 Opening section
14 Post electrode
15 Insulating material
16 Upper via
19 Second upper wiring
20 Lower insulating layer
21 Electrode terminal
22 Insulator layer
23 Rewiring
24 Insulating layer
25 Upper wiring
31 Functional element
32 First wiring
33 First insulating layer
34 First via
35 Second wiring
36 Second insulating layer
37 Second via
38 Third wiring
39 Third insulating layer
40 Third via
41 Fourth wiring
42 First rewiring
43 Second rewiring
44 Insulating material
45 Post electrode
46 Upper via
47 Upper wiring
48 First rewiring via
49 Second rewiring via
51 First back surface wiring layer
52 Second back surface wiring layer
61 Front surface wiring layer
101 Support plate
102 First wiring
103 First insulating layer
104 First via
105 Second wiring
106 Second insulating layer
107 Second via
108 Third wiring
109 Third insulating layer
110 Third via
111 Fourth wiring
112 Opening section
113 Support plate
114 Lower insulating layer
115 Functional element
116 Electrode terminal
117 Upper insulating layer
118 Lower via
119 Upper via
120 Upper wiring
121 Lower wiring
201 Support plate
202 Upper insulating layer
203 First upper wiring
204 Insulating layer A
205 Via A 206 Insulating layer B
207 Wiring B
208 Via B
209 Insulating layer C
210 Wiring C
211 Via C
212 Insulating layer D
213 Wiring D
214 Via D
215 Lower wiring
216 Opening section
217 Support plate
218 Lower insulating layer
219 Functional element
220 Electrode terminal
221 Upper insulating layer
222 Upper via
223 Second upper wiring
301 Functional element
302 Wiring layer
303 Inner via

What is claimed:

1. A functional element built-in substrate including,
a functional element provided with an electrode terminal on one surface side of the functional element, and
a wiring substrate including a laminated structure in which the functional element is embedded so that the electrode terminal of the functional element faces the front surface side of the structure, and which is formed at least in a side surface region of the functional element by laminating a plurality of wiring insulating layers each including a wiring,
wherein the electrode terminal and the back surface side of the wiring substrate are electrically connected through the wiring of the laminated structure, and
wherein, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, has a relationship that the cross-sectional area of the wiring in the back surface side wiring insulating layer is larger than the cross-sectional area of the wiring in the front surface side wiring insulating layer,
wherein, in any pair of the wiring insulating layers included in the laminated structure and that are in contact with each other, the cross-sectional shape of the wiring in each of the wiring insulating layers has a relationship that the cross-sectional area of the wiring in the back surface side wiring insulating layer is larger than the cross-sectional area of the wiring in the front surface side wiring insulating layer.

2. The functional element built-in substrate according to claim 1, wherein each of the plurality of wiring insulating layers includes one layer of the wiring.

3. The functional element built-in substrate according to claim 1, wherein at least one of the plurality of wiring insulating layers includes two or more wiring layers each including a wiring having the equivalent cross-sectional area.

4. The functional element built-in substrate according to claim 1, wherein, in the relationship between a pair of the wiring insulating layers included in the laminated structure and that are in contact with each other, the width of the cross-sectional shape of the back surface side wiring insulating layer is larger than the width of the cross-sectional shape of the front surface side wiring insulating layer.

5. The functional element built-in substrate according to claim 1, wherein, in the relationship between a pair of the wiring insulating layers included in the laminated structure and that are in contact with each other, the height of the cross-sectional shape of the back surface side wiring insulating layer is larger than the height of the cross-sectional shape of the front surface side wiring insulating layer.

6. The functional element built-in substrate according to claim 1, wherein each of the plurality of wiring insulating layers in the laminated structure further includes a via in contact with the wiring.

7. The functional element built-in substrate according to claim 6, wherein, in the relationship between a pair of the wiring insulating layers included in the laminated structure and that are in contact with each other, the horizontal cross-sectional shape of the via in each of the wiring insulating layers is configured such that the cross-sectional area of the via in the back surface side wiring insulating layer is larger than the cross-sectional area of the via in the front surface side wiring insulating layer.

8. The functional element built-in substrate according to claim 6, wherein the diameter of the via in the laminated structure is configured such that the diameter of the back surface side of the wiring substrate is larger than the diameter of the front surface side of the wiring substrate.

9. The functional element built-in substrate according to claim 1, wherein, in the relationship between a pair of the wiring insulating layers included in the laminated structure and that are in contact with each other, the thickness of the back surface side wiring insulating layer is larger than the thickness of the front surface side wiring insulating layer.

10. The functional element built-in substrate according to claim 1, further comprising, above the functional element and the wiring substrate, a wire for electrically connecting the electrode terminal of the functional element to the front surface side wiring of the wiring substrate.

11. The functional element built-in substrate according to claim 1, further comprising, above the functional element and the wiring substrate, another wiring substrate for electrically connecting the electrode terminal of the functional element to the front surface side wiring of the wiring substrate.

12. The functional element built-in substrate according to claim 1, further comprising, above the functional element and the wiring substrate, another functional element for electrically connecting the electrode terminal of the functional element to the front surface side wiring of the wiring substrate.

13. The functional element built-in substrate according to claim 1, wherein the wiring substrate further includes one or more back surface wiring layers on the back surface side of the wiring substrate.

14. The functional element built-in substrate according to claim 1, further comprising an external connection terminal on the front surface side or the back surface side of the functional element built-in substrate.

15. An electronic device comprising the functional element built-in substrate according to claim 1.

16. A functional element built-in substrate including,
a functional element provided with an electrode terminal on one surface side of the functional element, and
a wiring substrate including a laminated structure in which the functional element is embedded so that the electrode terminal of the functional element faces the front surface side of the structure, and which is formed at least in a side surface region of the functional element by laminating a plurality of wiring insulating layers each including a wiring, wherein the electrode terminal and the back surface side of the wiring substrate are electrically connected through the wiring of the laminated structure, and wherein, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, has a relationship that the cross-sectional area of the wiring in the back surface side wiring insulating layer is larger than the cross-sectional area of the wiring in the front surface side wiring insulating layer, and the functional element built-in substrate further comprising a rewiring structure layer comprised of one or more rewiring insulating layers each including a rewiring on the electrode terminal of the functional element, wherein the rewiring structure layer includes a plurality of rewiring insulating layers, and wherein, in any pair of the rewiring insulating layers included in the rewiring structure layer and that are in contact with each other, the cross-sectional shape of the rewiring in each of the rewiring insulating layers, which cross-sectional shape is taken along the plane perpendicular to the extension direction of the rewiring in the rewiring insulating layer, has a relationship that the cross-sectional area of the rewiring in the front surface side rewiring insulating layer is larger than the cross-sectional area of the rewiring in the back surface side rewiring insulating layer.

17. A functional element built-in substrate including, a functional element provided with an electrode terminal on one surface side of the functional element, and a wiring substrate including a laminated structure in which the functional element is embedded so that the electrode terminal of the functional element faces the front surface side of the structure, and which is formed at least in a side surface region of the functional element by laminating a plurality of wiring insulating layers each including a wiring, wherein the electrode terminal and the back surface side of the wiring substrate are electrically connected through the wiring of the laminated structure, and wherein, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, has a relationship that the cross-sectional area of the wiring in the back surface side wiring insulating layer is larger than the cross-sectional area of the wiring in the front surface side wiring insulating layer, and the functional element built-in substrate further comprising, above the functional element or the wiring substrate, one or more upper wiring layers each including an upper wiring for electrically connecting the electrode terminal of the functional element to the front surface side wiring of the wiring substrate, wherein, in the upper wiring layer in contact with the wiring insulating layer on the outermost surface side of the wiring substrate, the area of the cross-sectional shape of the upper wiring in the upper wiring layer, which cross-sectional shape is taken along the plane perpendicular to the extension direction of the upper wiring, is smaller than the area of the cross-sectional shape of the wiring in the wiring insulating layer on the outermost surface side of the wiring substrate, which cross-sectional shape is taken along the plane perpendicular to the extension direction of the wiring.

18. The functional element built-in substrate according to claim 17, further comprising a front wiring layer on the upper wiring layer.

19. A functional element built-in substrate including, a functional element provided with an electrode terminal on one surface side of the functional element, and a wiring substrate including a laminated structure in which the functional element is embedded so that the electrode terminal of the functional element faces the front surface side of the structure, and which is formed at least in a side surface region of the functional element by laminating a plurality of wiring insulating layers each including a wiring, wherein the electrode terminal and the back surface side of the wiring substrate are electrically connected through the wiring of the laminated structure, and wherein, in a pair of the wiring insulating layers included in the laminated structure and that are in contact with each other, the cross-sectional shape of the wiring in each of the wiring insulating layers, which cross-sectional shape is taken along the plane perpendicular to the extension direction of the wiring, has a relationship that the cross-sectional area of the wiring in the back surface side wiring insulating layer is larger than the cross-sectional area of the wiring in the front surface side wiring insulating layer, and the functional element built-in substrate further comprising a rewiring structure layer comprised of one or more rewiring insulating layers each including a rewiring on the electrode terminal of the functional element, and the functional element built-in substrate further comprising, above the rewiring structure layer and the wiring substrate, one or more upper wiring layers each including an upper wiring for electrically connecting the rewiring to the front surface side wiring of the wiring substrate, wherein the area of the cross-sectional shape of the wiring, which cross-sectional shape is taken along the plane perpendicular to the extension direction, is increased in the order of the rewiring, the upper wiring, and the wiring.

* * * * *